United States Patent [19]
Ristedt et al.

[11] Patent Number: 4,815,990
[45] Date of Patent: Mar. 28, 1989

[54] FLEXIBLE CIRCUIT HAVING TERMINATION FEATURES AND METHOD OF MAKING THE SAME

[75] Inventors: Raymond D. Ristedt, Mesa; Michael C. Zinck, Tempe, both of Ariz.

[73] Assignee: Rogers Corporation, Rogers, Conn.

[21] Appl. No.: 37,238

[22] Filed: Apr. 10, 1987

[51] Int. Cl.⁴ .............................................. H01R 9/07
[52] U.S. Cl. ...................................... 439/496; 29/846; 439/498; 439/930
[58] Field of Search ................. 439/67, 77, 492–499, 439/59–62; 29/846–850

[56] References Cited

U.S. PATENT DOCUMENTS

| | | | |
|---|---|---|---|
| 3,074,043 | 1/1963 | Stearns et al. | 439/498 |
| 3,084,302 | 4/1963 | Braeutigam | 439/496 |
| 3,461,221 | 8/1969 | Herb | 439/498 |
| 3,573,345 | 4/1971 | Devries | 439/77 |
| 3,576,519 | 5/1970 | Jayne | 439/681 |
| 3,605,060 | 9/1971 | Praeger et al. | 439/67 |
| 3,745,509 | 7/1973 | Woodward et al. | 439/493 |
| 3,897,130 | 8/1975 | Donnelly et al. | |
| 4,066,840 | 1/1978 | Allgaier | 439/496 |
| 4,085,502 | 4/1978 | Ostman et al. | 439/493 |
| 4,107,836 | 8/1978 | Roberts | 174/68.5 |
| 4,488,763 | 12/1984 | Ritter | 439/493 |
| 4,714,435 | 12/1987 | Stipanuk et al. | 439/496 |

FOREIGN PATENT DOCUMENTS

| | | |
|---|---|---|
| 0001477 | 4/1979 | European Pat. Off. . |
| 0226276 | 6/1987 | European Pat. Off. . |
| 1148647 | 4/1969 | United Kingdom . |

Primary Examiner—Neil Abrams
Attorney, Agent, or Firm—Fishman, Dionne & Cantor

[57] ABSTRACT

A flexible circuit having termination features incorporated as an integral part thereof and a method of making the same is presented. In accordance with the manufacturing process of the present invention, the end portion of a flexible circuit of standard construction (i.e., conductive traces sandwiched between a flexible base substrate and a flexible cover film) is folded back on itself, frequently with a spacer captured in the fold, and adhesively laminated together. This laminated assembly has a thickness equal to that required for formation of reliable connector pins. Next, a small section of this folded end portion has at least the outer non-conductive cover film removed, preferably by laser techniques, to expose a plurality of connector pins or fingers. The connector fingers will have the desired thickness, width and shape to allow for direct insertion into a mating component (i.e., through-holes on a rigid or flexible circuit board; or into a receptacle such as a female connector). The fingers are preferably solder coated to allow the flexible circuit of the present invention to be attached using common solder reflow techniques.

76 Claims, 23 Drawing Sheets

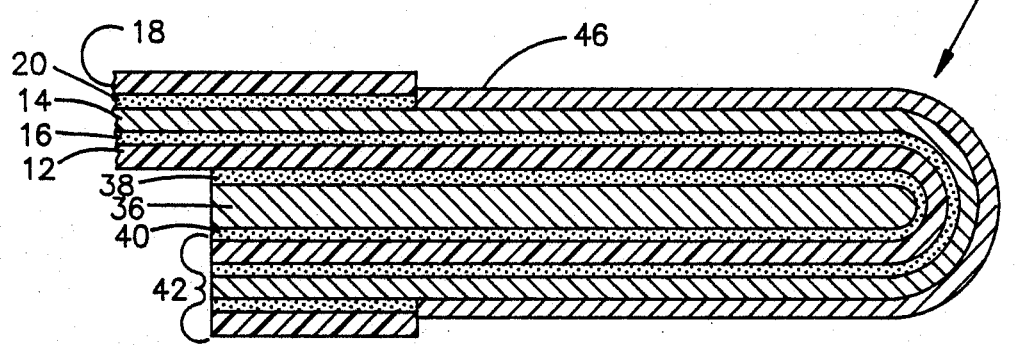

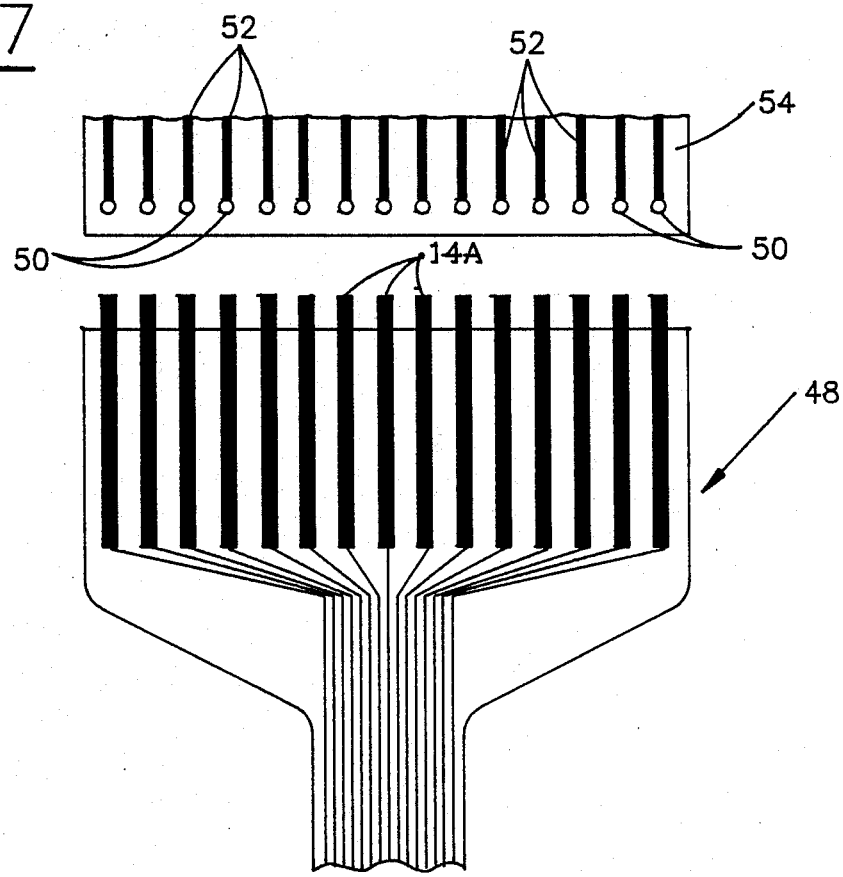

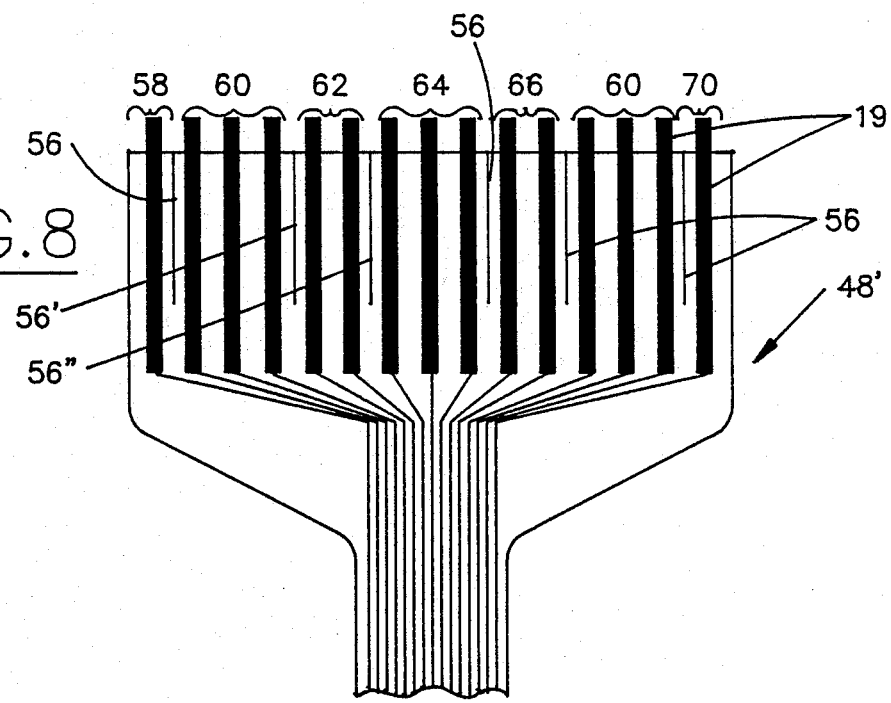
FIG.8
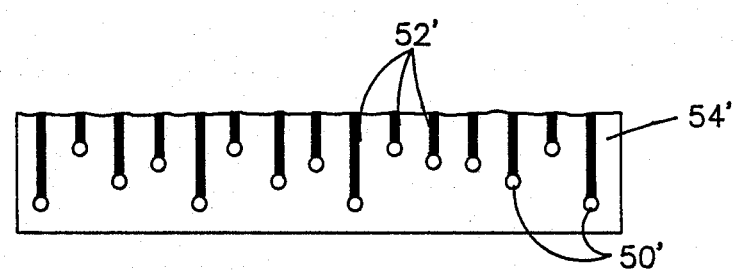
FIG.9
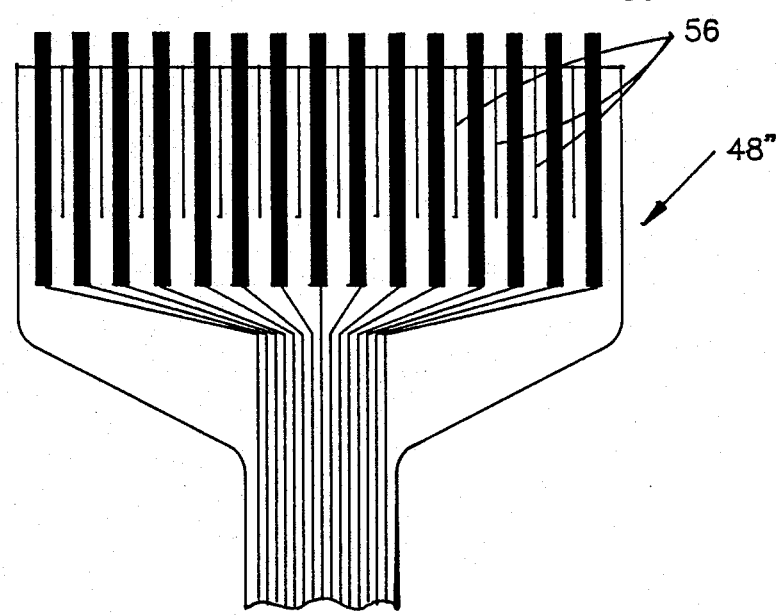

FLEXIBLE CIRCUIT HAVING TERMINATION FEATURES AND METHOD OF MAKING THE SAME

BACKGROUND OF THE INVENTION

This invention relates to a flexible circuit or wiring board and a method of making the same. More particularly, this invention relates to a flexible circuit which incorporates terminal or termination features (i.e., termination or terminal-like pins) as an integral part thereof thereby permitting connection between flexible circuits and other circuits or components without the use of an intermediate connector device therebetween.

Interconnections between flexible circuit boards and other circuit boards or components have been a source of problems for many years. A conventional method of effecting such interconnections has been to use separate connecting devices to link circuit traces on the flexible circuit to the mating circuitry. Typically, these connecting devices are comprised of well known high density pin and socket connectors which must be soldered, crimped or otherwise attached to circuit traces on the flexible circuit. However, it will be apparent that drawbacks and deficiencies are associated with the use of such separate connectors. These drawbacks include higher costs in terms of manufacturing and purchasing, higher weight and size (associated with the connectors), inability to achieve desired density of interconnections, and increased chance for failure because of the multiplicity of connections which must be made between each contact in the connector and the traces on the flexible circuit.

Recently, an alternative solution to providing electrical connections between flexible circuits and other electrical devices which eliminates the use of separate electrical connectors has been suggested. In this alternative technique, a flexible circuit comprising a plurality of spaced metallic conductors include one or more flexible areas and integral rigid terminals. These terminals are formed from a relatively rigid metallic sheet by selectively reducing the sheet in cross-section so as to define the conductor patterns and terminal ends and to render flexible, (at areas of reduced cross-section), areas of the conductors. The metallic flexible conductors and rigid terminal ends are then attached to flexible insulating films to support the conductors and to maintain them in spaced relation to one another; or alternatively the metallic conductor is predisposed as a laminate on a film. The metallic sheet preferably initially has a thickness substantially equal to that required for the terminal ends. Alternatively, it is also possible to start with a metallic sheet, somewhat thinner than that required for the terminal ends, process as before, and then plate additional metal onto the terminal ends to achieve a required thickness.

In still another alternative embodiment, a metallic sheet having a thickness approximately equal to the conductor flexible areas is used as a starter material. Next, one or more mesas are formed on the edge regions of the sheet so that the thickened edge regions are integral with the sheet central areas. Thereafter, the conductive areas are chemically milled so as to define conductor patterns and terminal areas. This latter process is described in U.S. Pat. No. 4,085,502.

Flexible circuits of the type described above (which are characterized by thinning down portions of a metal sheet to form flexible traces and rigid terminal pins) are marketed under the trademark SCULPTURED by Advanced Circuit Technology of Merrimack, N.H.

While solving some of the disadvantages associated with separate connector devices, the SCULPTURED type of flexible circuit has many of its own problems. For example, the manufacturing technique utilizes conductive material (i.e., copper) two to three times thicker than necessary with most of this copper being etched away in at least two imaging and etching steps so that the central portion is thinned down and the edges remain thick and rigid for connection to another circuit component. As a result, the SCULPTURED circuits are quite expensive to manufacture due to the costly substraction (etching) processing steps and increased materials cost. Furthermore, due to the imprecision of this extensive etching process conductor definition is frequently not accurate enough to meet demanding technical requirements for certain electrical properties, e.g. controlled impedance. Also, this method may create conductors that would frequently be unsuitable for dynamic applications.

SUMMARY OF THE INVENTION

The above-referenced and other problems and deficiencies of the prior art are overcome or alleviated by the flexible circuit having terminal features incorporated as an integral part thereof of the present invention. In accordance with the present invention, a method of manufacturing a flexible circuit and the circuit formed thereby eliminates the need for separate connectors used to interface flexible circuits and other components; and provides an improved alternative to those flexible circuits with integral terminal features formed by expensive substrative processes.

In accordance with the manufacturing process of the present invention, the end portion of a flexible circuit of standard construction (i.e., conductive traces sandwiched between a flexible base substrate and a flexible cover film) is folded back on itself (sometimes with a spacer captured in the fold), mechanically formed and adhesively laminated together. This laminated assembly has a thickness equal to that required for formation of reliable connector pins. Next, a small section of this folded end portion has at least the outer non-conductive cover film removed, preferably by laser techniques, to expose a plurality of connector pins or fingers. The connector fingers will have the desired thickness, width and shape to allow for direct insertion into a mated component (i.e., through-holes on a flexible or rigid circuit board; or into a receptacle such as a female connector). The fingers are preferably solder coated or plated to allow the flexible circuit of the present invention to be attached using common solder reflow techniques.

The above-described and other features and advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES:

FIG. 6 is a cross-sectional elevation view of the flexible circuit of FIG. 1A in accordance with a sixth step in the manufacturing process of the present invention;

FIG. 7 is a plan view of a first embodiment of a flexible circuit of the present invention;

FIG. 8 is a plan view of a second embodiment of a flexible circuit in accordance with the present invention;

FIG. 9 is plan view of a third embodiment of a flexible circuit in accordance with the present invention;

DESCRIPTION OF THE PREFERRED EMBODIMENT

Figure 1A:
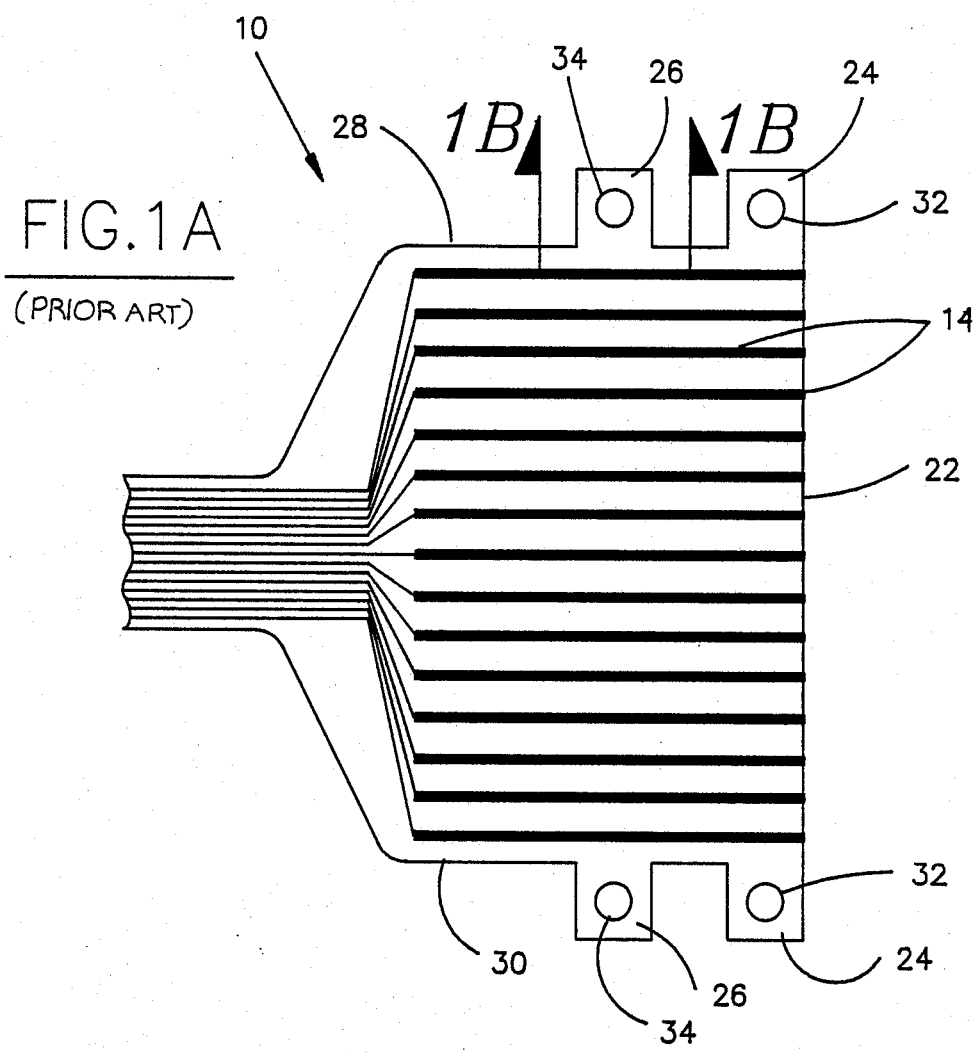
FIG. 1A is a plan view of a portion of a flexible circuit used in conjunction with the method of manufacture of the present invention.
Figure 1B:
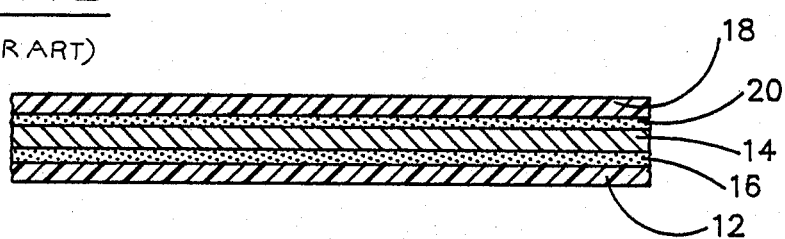
FIG. 1B is a cross-sectional view along the line 1B—1B of FIG. 1A.

Referring first to FIGS. 1A and 1B, an end portion of a conventional and well known flexible circuit is shown generally at 10. The construction of flexible circuit 10 is standard and includes a flexible base or substrate material 12 comprised of a non-conductive polymeric material, (usually polyimide or polyester) having conductive material 14 (usually copper) attached to substrate 12 by use of a suitable and known adhesive 16. Conductive layer 14 has a protective covering provided by cover film 18 which attaches to conductive layer 14 by way of another adhesive layer 20. This single sided flexible circuit is typically manufactured by well know circuit forming techniques involving imaging, etching and lamination steps. It will be appreciated that flexible circuit 10 may also be manufactured by methods which do not necessitate adhesive layer 16 such as known sputtering or vapor deposition techniques. Also, flexible circuit 10 may comprise a double sided or multilayer circuit as will be discussed in more detail hereinafter.

As shown in FIG. 1A, conductive layer 14 is imaged and etched to form a plurality of conductive circuit traces 14 which terminate at an edge 22 of flexible circuit 10. Flexible circuits 10 may also include a first set of tabs 24 coterminous with edge 22 and a second set of tabs 26 spaced inwardly from tabs 24 along the two opposing side edges 28 and 30 of flexible circuit 10. Each set of tabs 24 and 26 include openings 32 and 34, respectively. Tabs 24 and 26 could be used for alignment during the bending process as will be discussed with regard to FIGS. 3A and 3B. The tabs are generally removed in subsequent applications and need not be coterminous.

Figure 2A:
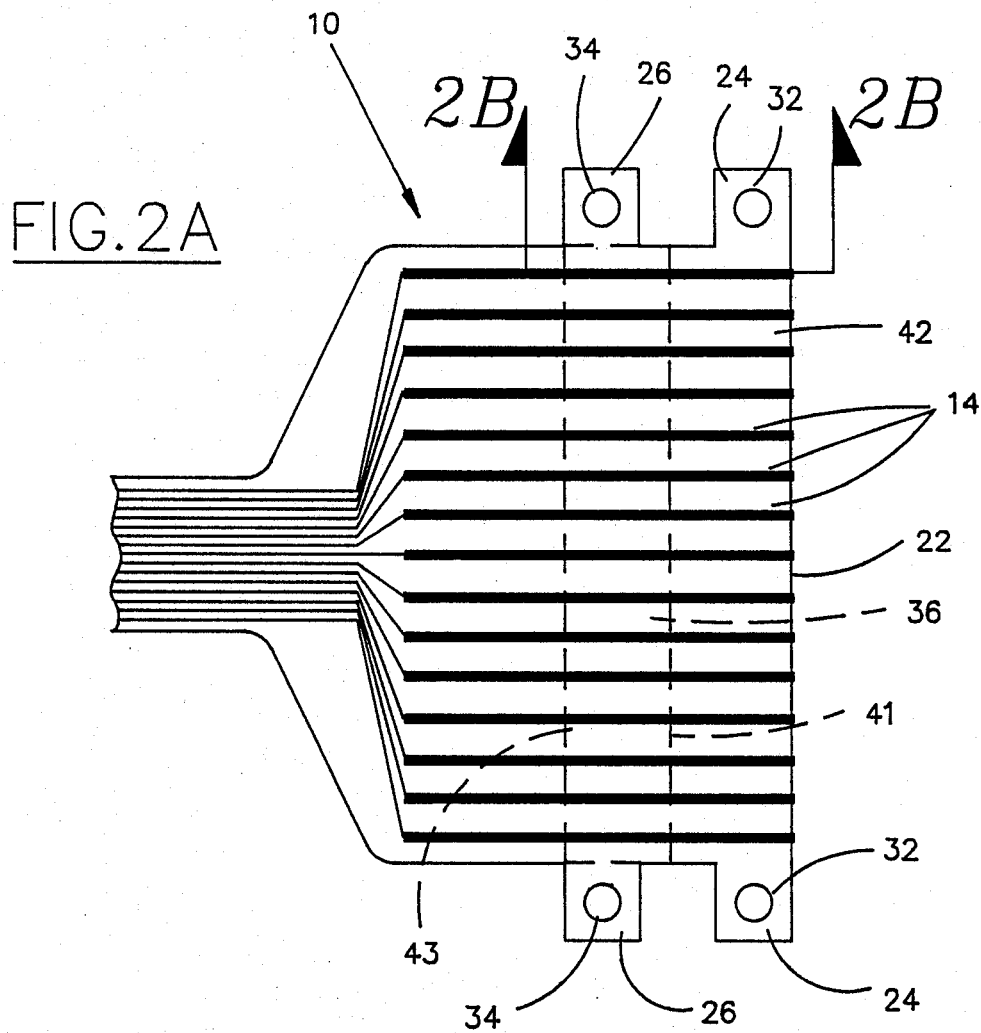
FIG. 2A is a plan view of the circuit of FIG. 1A in accordance with a second step in the manufacturing process of the present invention.
Figure 2B:
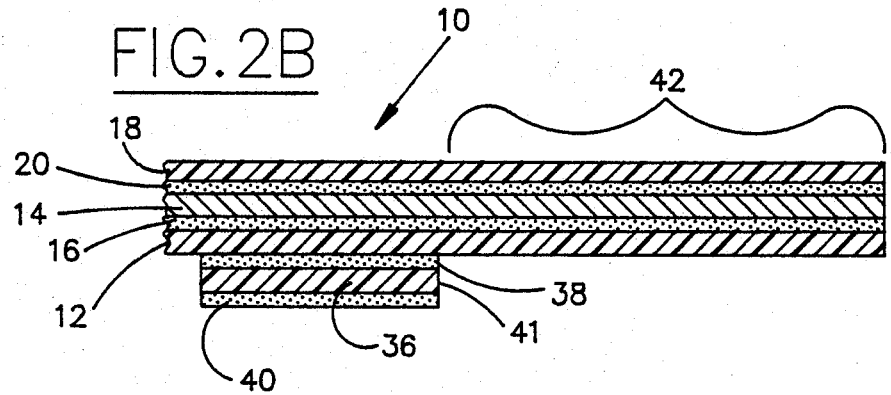
FIG. 2B is a cross-sectional elevation view along the line 2B—2B of FIG. 2A.

Turning now to FIGS. 2A and 2B, in a second step in accordance with the manufacturing process of the present invention, a discreet spacer or stiffener layer 36, which is preferably comprised of a non-conductive polymeric film such as polyimide, is adhesively attached to flexible circuit base 12 via an adhesive layer 38 in a position substantially parallel to edge 22. Also, a second adhesive layer 40 is provided on the bottom exposed surface of spacer layer 36. As shown by the dash lines 41 and 43 in FIG. 2A, spacer layer 36 is preferably positioned so as to include the entire width of interior tabs 26 and to further extend to about the midway point between the space separating tabs 24 and 26. In other words, stiffener 36 is spaced from edge 22 a distance which is about equal to the width of stiffener 36. As a result, circuit 10 will now include a terminal flap 42 having a width which is about equal to the width of spacer layer 36.

Figure 3A:
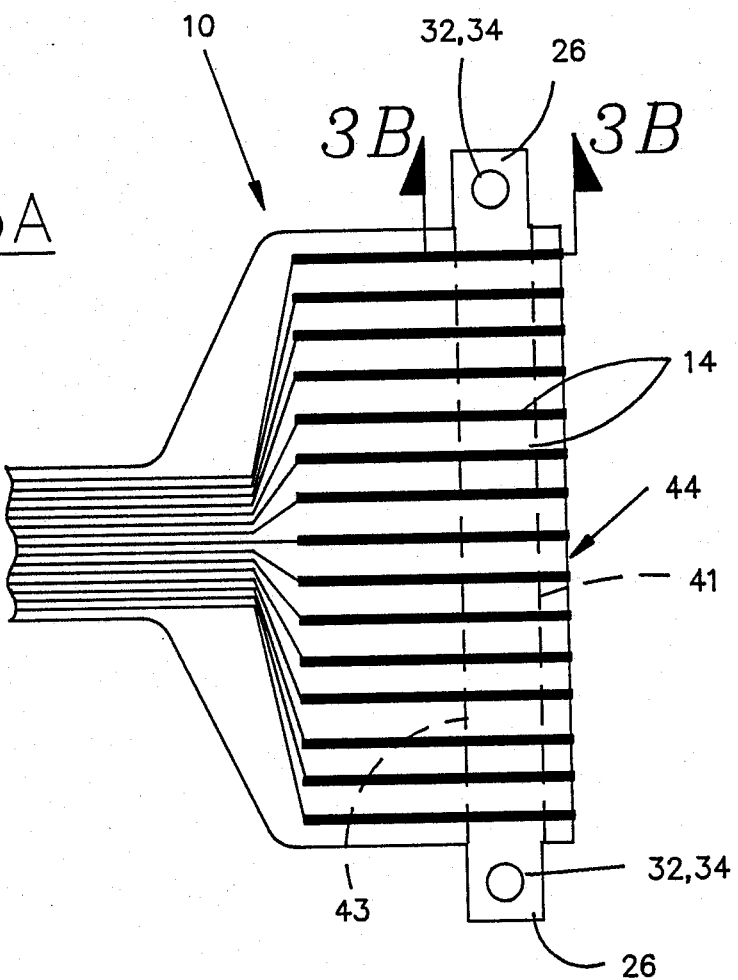
FIG. 3A is a plan view of the flexible circuit of FIG. 1A in accordance with a third step in the manufacturing process of the present invention.
Figure 3B:
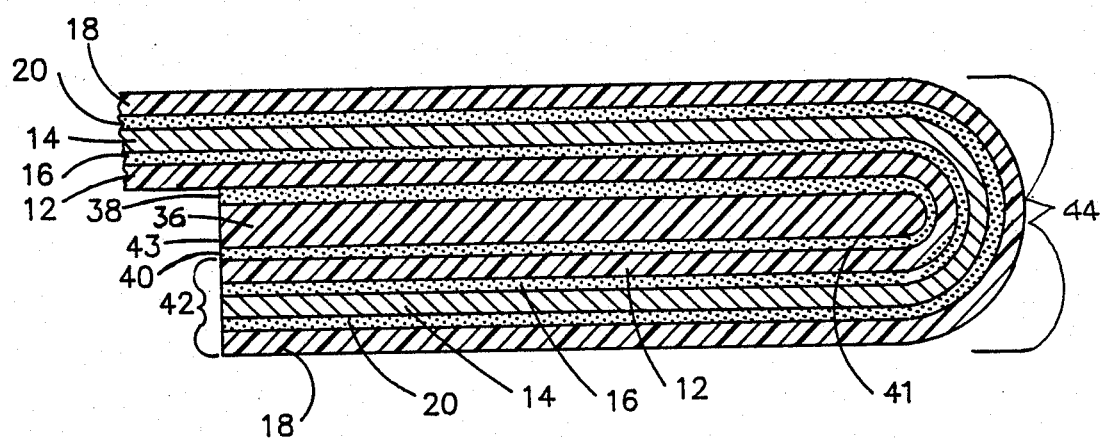
FIG. 3B is a cross-section elevation view along the line 3B—3B of FIG. 3A.

Next, as shown in FIGS. 3A and 3B, flexible circuit 10 is folded back on itself by folding terminal flap 42 downwardly so as to enclose and capture spacer element 36 therein. It will be appreciated that adhesive layer 40 will contact and adhere to the exposed non-conductive substrate or base 12 which forms a part of flap 42. During this folding operation, it will be appreciated that tabs 24 on flap 42 will align with tabs 26 so that openings 32 and 34 will communicate to form a single opening. Preferably, edge 22 will align with edge 43 of spacer 36 during this folding operation. The stackup as shown in FIGS. 3A and 3B is then laminated to cure the several adhesive layers and thereby provide a relatively thick terminal end section 44 on the remaining relatively thinner portions of flexible circuit 10 (see FIG. 3B). Of course, in an alternative and equally preferable method of construction, flexible circuit 10 may be folded back on itself so that cover film 18 will be internally positioned and will capture spacer element 36. Such a construction would arise if FIG. 3B is viewed from an opposing direction.

Figure 4A:
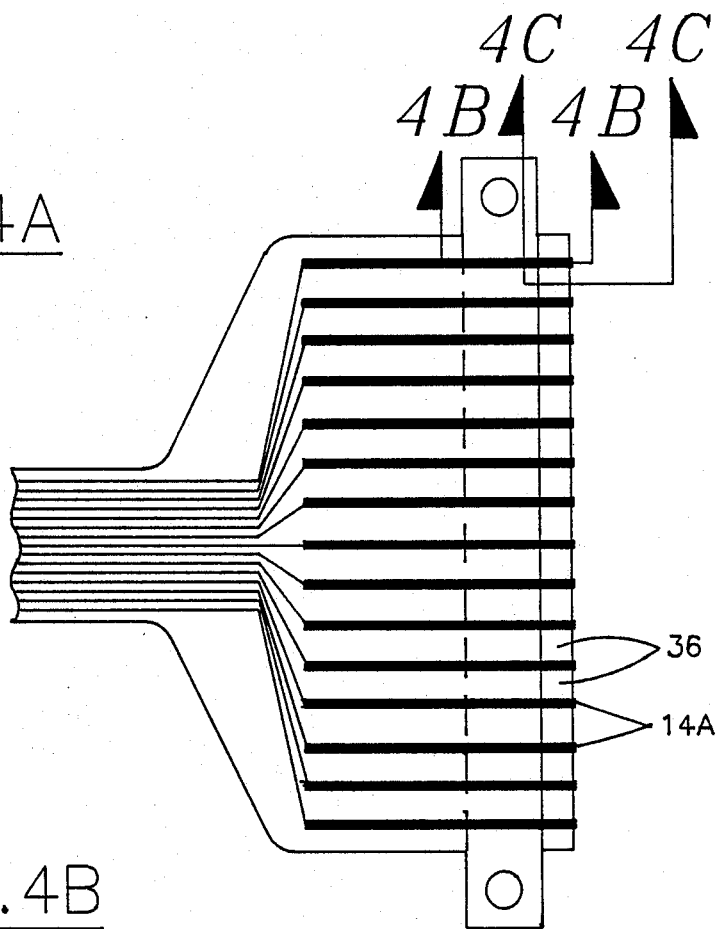
FIG. 4A is a plan view of the flexible circuit of FIG. 1A in accordance with a fourth step in the manufacturing process of the present invention.
Figure 4B:
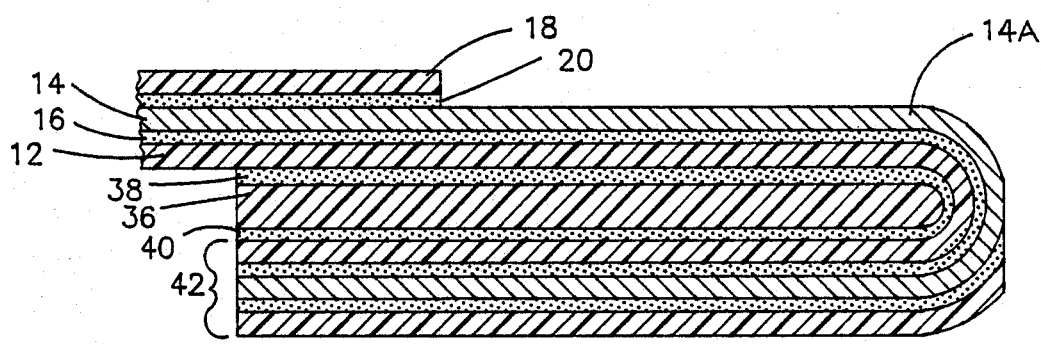
FIG. 4B is a cross-sectional elevation view along the line 4B—4B of FIG. 4A.
Figure 4C:
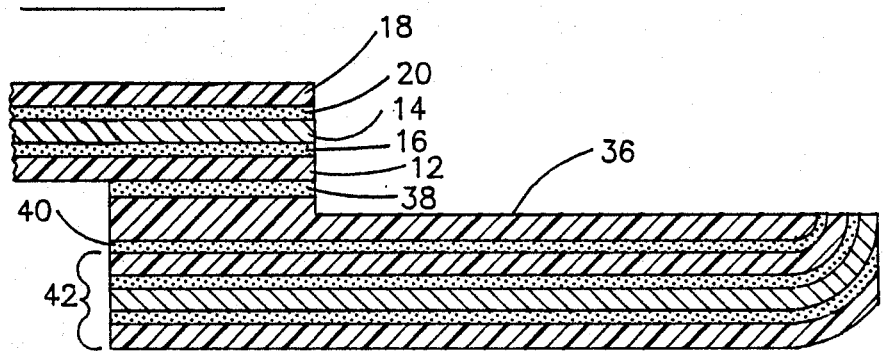
FIG. 4C is a cross-sectional elevation view along the line 4C—4C of FIG. 4A.
Figure 5A:
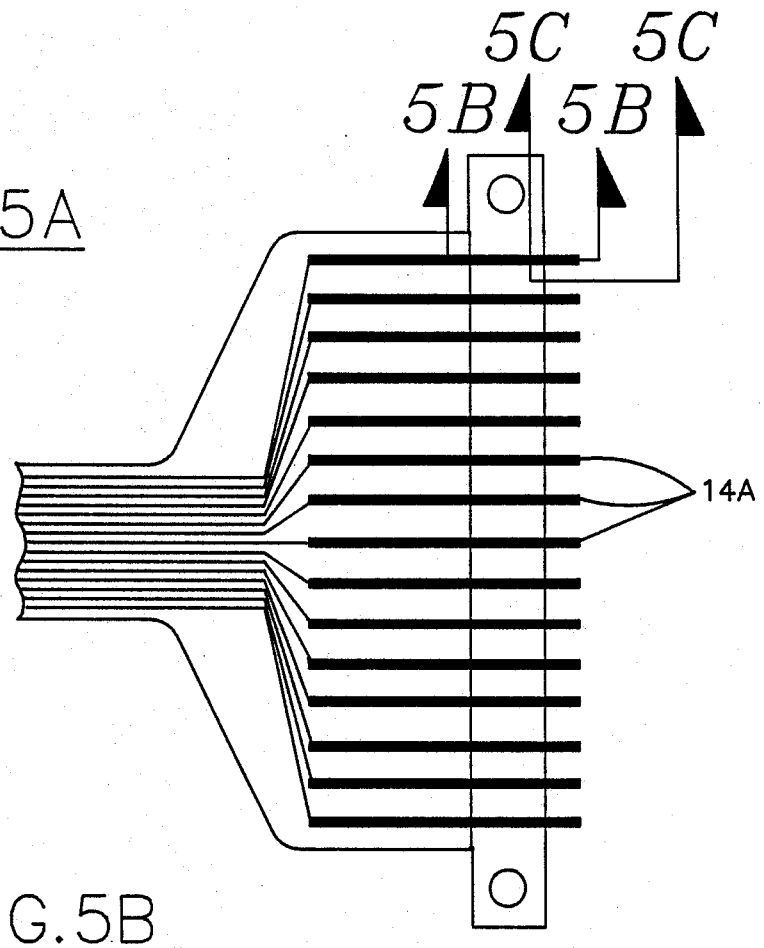
FIG. 5A is a plan view of the flexible circuit of FIG. 1A in accordance with a fifth step in the manufacturing process of the present invention.
Figure 5B:
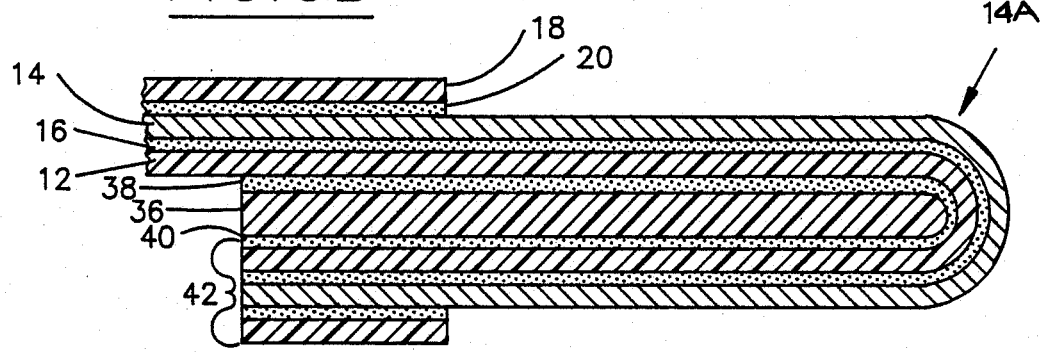
FIG. 5B is a cross-section elevation view along the line 5B—5B of FIG. 5A.
Figure 5C:
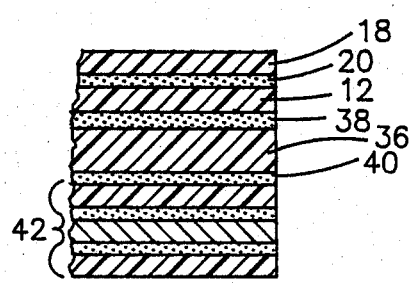
FIG. 5C is a cross-sectional elevation view along the line 5C—5C of FIG. 5A.

Subsequent to lamination, a terminal portion of end section 44 (typically about 0.25") is ablated to expose the conductive circuit trace 14 under the outer layer of insulation (i.e., cover film 18) and adhesive layer 20. While this outer layer of insulation may be removed by chemical etching techniques, preferably, a laser is used to expose the conductive traces 14. Using such a laser technique, trace 14 is preferably exposed in a two-step process. Thus, as shown in FIGS. 4A-4C, initially a first side of terminal section 44 has cover film 18 and adhesive 20 removed therefrom to expose a first half of a conductive pin or finger 14A. This first laser exposure is followed by a second laser exposure shown in FIGS. 5A-5C wherein the other side of cover film 18 and adhesive 20 is removed. As shown in FIGS. 4C and 5C, the laser technique will remove all of the various layers of non-conductive substrates and adhesive which lie in between conductive traces 14 (frequently aided by a cleaning technique) so as to define individual finger like terminal pins 14A which are an integral part of the remaining traces 14 of flexible circuit 10. This cleaning technique often consist of a plasma etching.

It will be appreciated that the thickness of spacer or stiffener 36 and the various non-conductive film layers are important in providing the final appropriately dimensioned pins or fingers 14A. Preferably, the thickness of spacer 36 and the remaining layers of the laminate are selected so as to provide a desired "pin" thickness of about 0.01". Note that rather than using a spacer 36, relatively thick base and cover films 12 and 18 could be utilized to supply (when doubled or folded over) the requisite thickness while still retaining flexibility in the remainder of the circuit. Of course, an adhesive layer would still be used to keep the folded over circuit together. It will be appreciated that the conductive traces 14 will produce the desired "pin" width. The length of each pin or finger 14A is determined by the amount of material ablated during the laser treatment. As mentioned, the finger length frequently is about 0.25" but may be varied continuously or by terminal. The plurality of resultant fingers 14A are thus appropriately dimensioned (length, width and thickness dimensions) to allow for direct insertion of the fingers into a mating component. These fingers 14A have the requisite structural integrity to provide this termination functioning, while the remaining portion of the circuit remains a standard flexible circuit material. The shape of the pins are various and are determined or created by common photo imaging techniques.

Preferably, fingers 14A are solder coated or plated to allow circuit 10 to be attached to another component using common solder reflow techniques. An example of a finger 14A having been coated with a layer of solder 46 is shown in FIG. 6.

The flexible circuits of the present invention having terminal features incorporated as an integral portion thereof may be connected in a conventional manner to other circuit boards or electronic components. For example, in FIG. 7, one end of a flexible circuit 48 is shown having a plurality of conductive fingers 14A extending outwardly therefrom. It will be appreciated that conductive fingers 14A form connector pins which may be received in conventional through hole openings 50 attached to circuit traces 52 on a mating flexible or rigid circuit board 54. If connective fingers 14A have been coated with solder as in FIG. 6, fingers 14A are simply inserted into through holes 50 whereupon known solder reflow techniques provide reliable mechanical and electrical connection between flexible circuit 48 and circuit board 54 (see FIGS. 13A and 13B).

While flexible circuit 48 of FIG. 7 must be attached to a linear row of through holes, it will be appreciated that the present invention may be easily tailored for attachment to non-linearly arranged through hole openings in a mating circuit board or electronic component. For example, in FIG. 8 longitudinal slits or cuts 56 have been formed along an appropriate length of circuit 48' so that one or more of fingers 14A may be flexed outwardly away from an adjoining group of fingers. Thus, in FIG. 8, a first finger 14' may be flexed outwardly away from the remainder of flex circuit 48' along cut 56 to define a first connector 58. Next, three fingers 14' are kept together as a group between cuts 56 and 56' to define a second connector 60. Similarly, cuts 56' and 56" define therebetween a third connector 62 having two fingers 14' therein. The rest of circuit 48' is similarly divided into preselected groups via slits 56 to define connectors 64, 66, 68 and 70. It will be appreciated that cuts 56 may be formed by any appropriate means including laser means to define connector portion having one or more fingers 14' therein.

In FIG. 9, cuts 56 are provided between each and every finger 14' to permit fingers 14' to connect into a desired linear or non-linearly arranged circuit board such as is shown at 54'.

Figure 10:
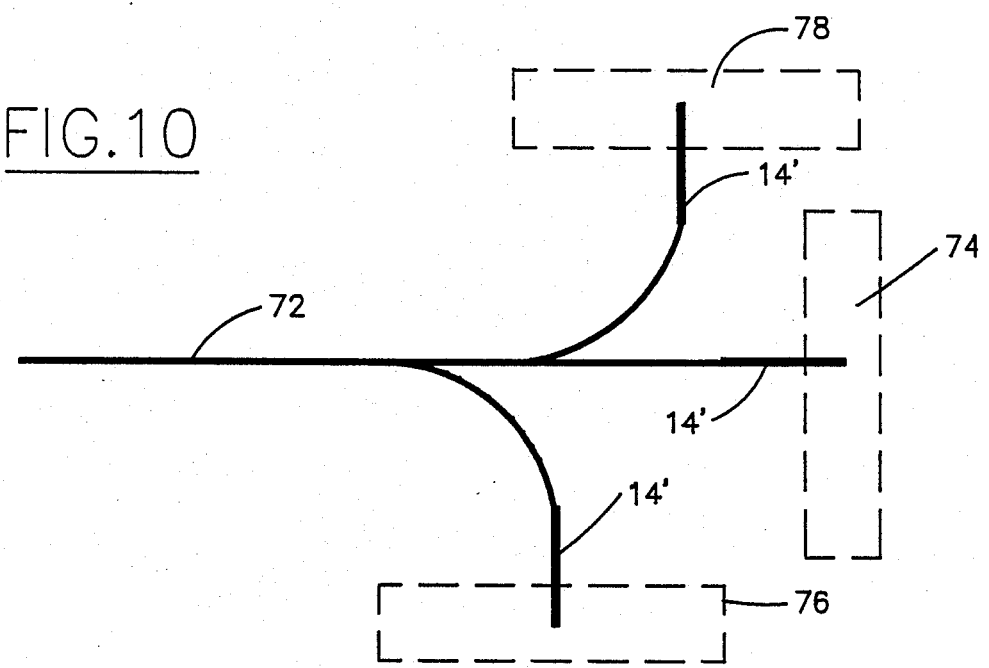
FIG. 10 is a diagrammatic view of the flexible circuit of the present invention shown connected to three separate electronic components.
Figure 11:
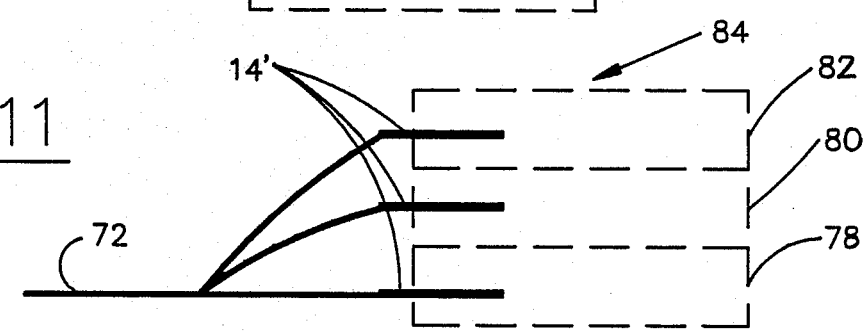
FIG. 11 is diagrammatic view of the flexible circuit in accordance with the present invention shown connected to a multilayer electronic device.
Figure 12:
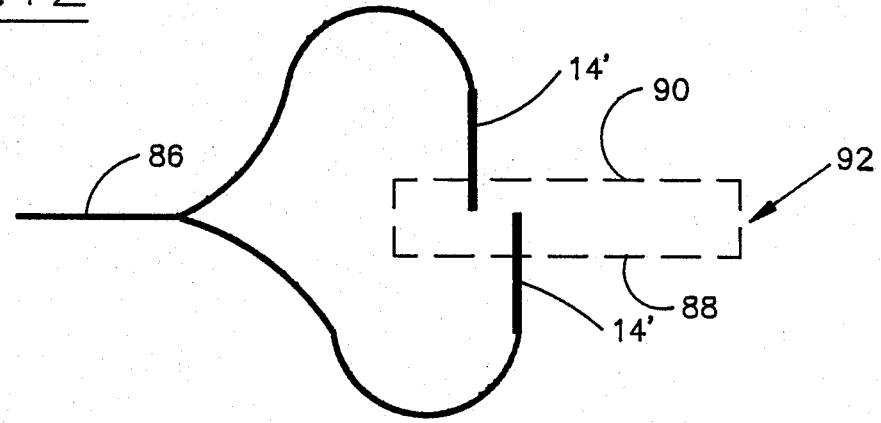
FIG. 12 is a diagrammatic view of the flexible circuit of the present invention shown connected to opposing sides of another electronic component.

Turning now to FIGS. 10-12, diagrammatic representations of flexible circuits having terminal pins integrally attached thereto in accordance with the present invention are shown in three separate connection schemes as examples of the versatility of the present invention. In FIG. 10, a flexible circuit 72 has its terminal ends slit as in FIGS. 8 or 9 such that fingers 14' may be connected to a plurality (in this example three) of individual spaced circuit boards 74, 76, and 78. FIG. 11 depicts the circuit board 72 of FIG. 10 being connected to three distinct layers 78, 80 and 82 of a well known multilayer circuit board 84. Finally, in FIG. 12, a flexible circuit board 86 having cuts or slits as described above, is shown connected to opposing surfaces 88 and 90 of a circuit board 92. FIGS. 11 and 12 are examples of the ability of the present invention to effect multiplanar connections.

It will be appreciated that the fingers or pins 14A formed in accordance with the present invention may be bent into a desired configuration subsequent to formation. For example, in FIGS. 13A and 13B, each of finger 14A have been bent downwardly about 90 degrees so that flexible circuit 94 may be connected in a parallel fashion to circuit board 96. It will be understood that circuit board 96 includes a rigid or flexible substrate 98 having conductive circuit traces 100 thereon. Electronic components 102, 104, and 106 can be mounted on circuit board 96 and connected to traces 100.

Figure 14:
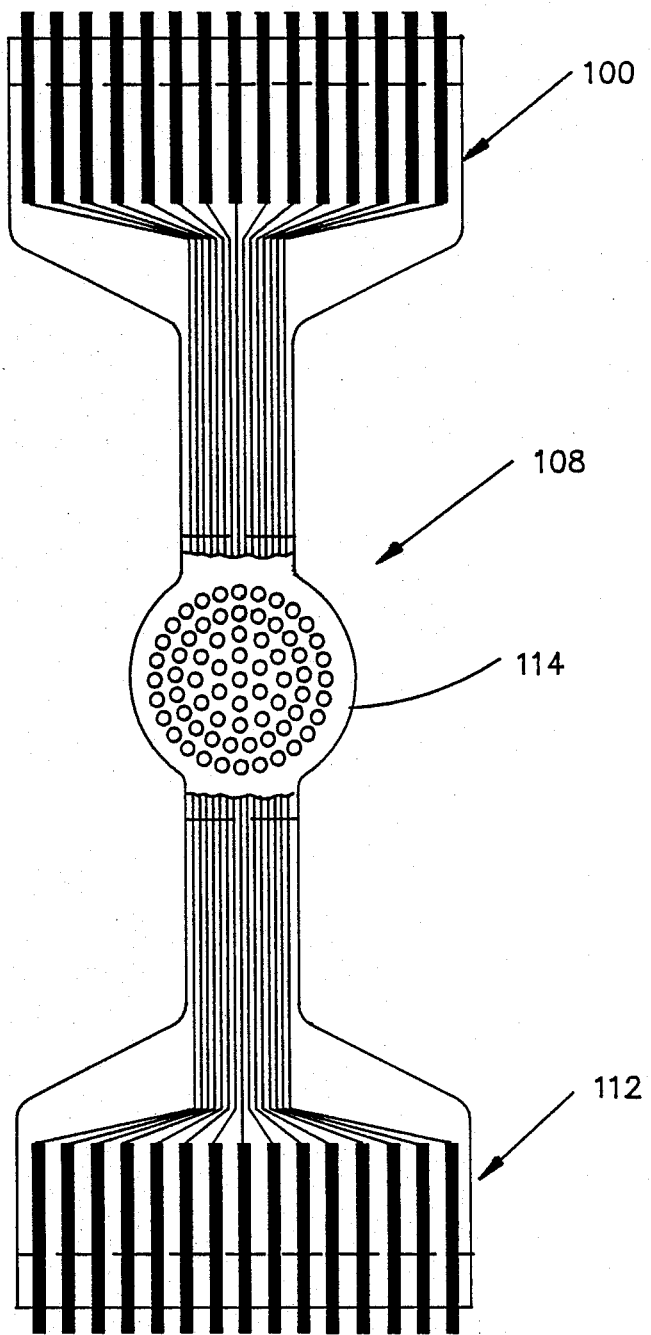
FIG. 14 is yet another example of a flexible circuit manufactured in accordance with the present invention.

In FIG. 14, a flexible circuit manufactured in accordance with the present invention is shown at 108. Flexible circuit 108 includes opposed circuit ends 110 and 112 which are substantially similar to flexible circuit ends 48, 48' and 48" in FIGS. 7-9 respectively. Flexible circuit 108 has a plurality of circuit traces thereon which lead to a well known cylindrical connector pattern 114 for mounting electronic components thereon as is well known in the art. Thus, it will be appreciated from a review of FIG. 14, that the present invention may be used on any type of flexible circuit whereby the flexible circuit will include integrally attached termination features for attachment to a mating electronic component or device.

Figure 15:
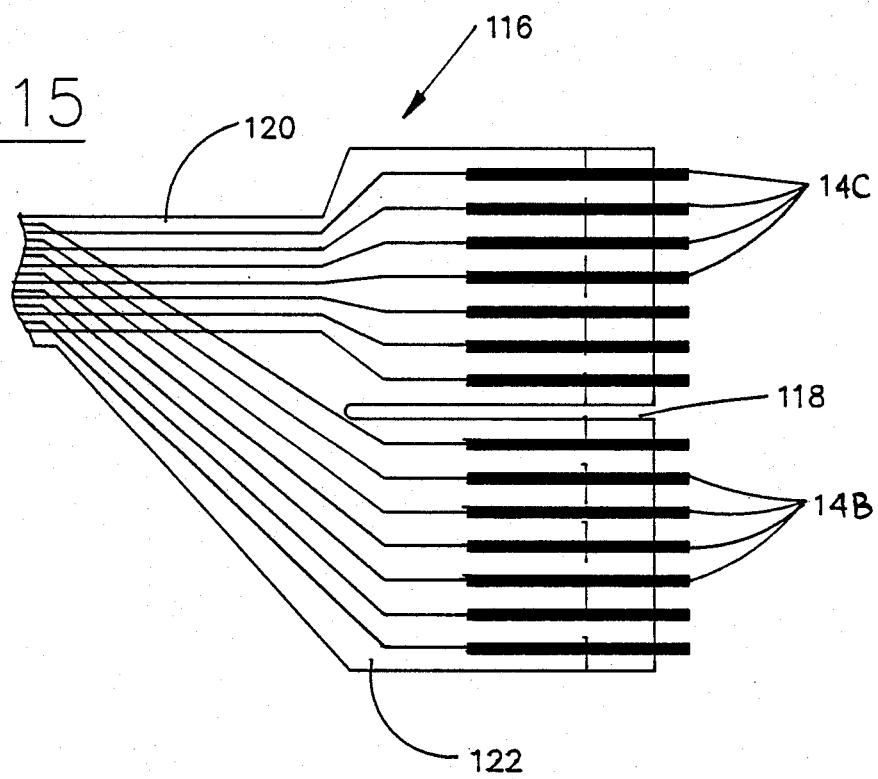
FIG. 15 is a plan view of a portion of a flexible circuit used to manufacture higher density termination pins relative to the embodiment shown in FIG. 1A.
Figure 16:
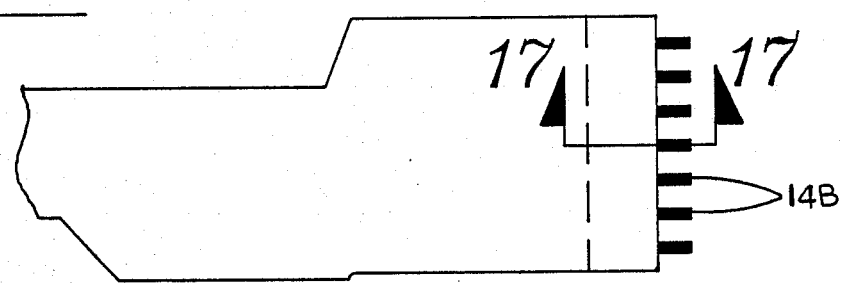
FIG. 16 is a plan view of a flexible circuit of FIG. 15 subsequent to folding.
Figure 17:
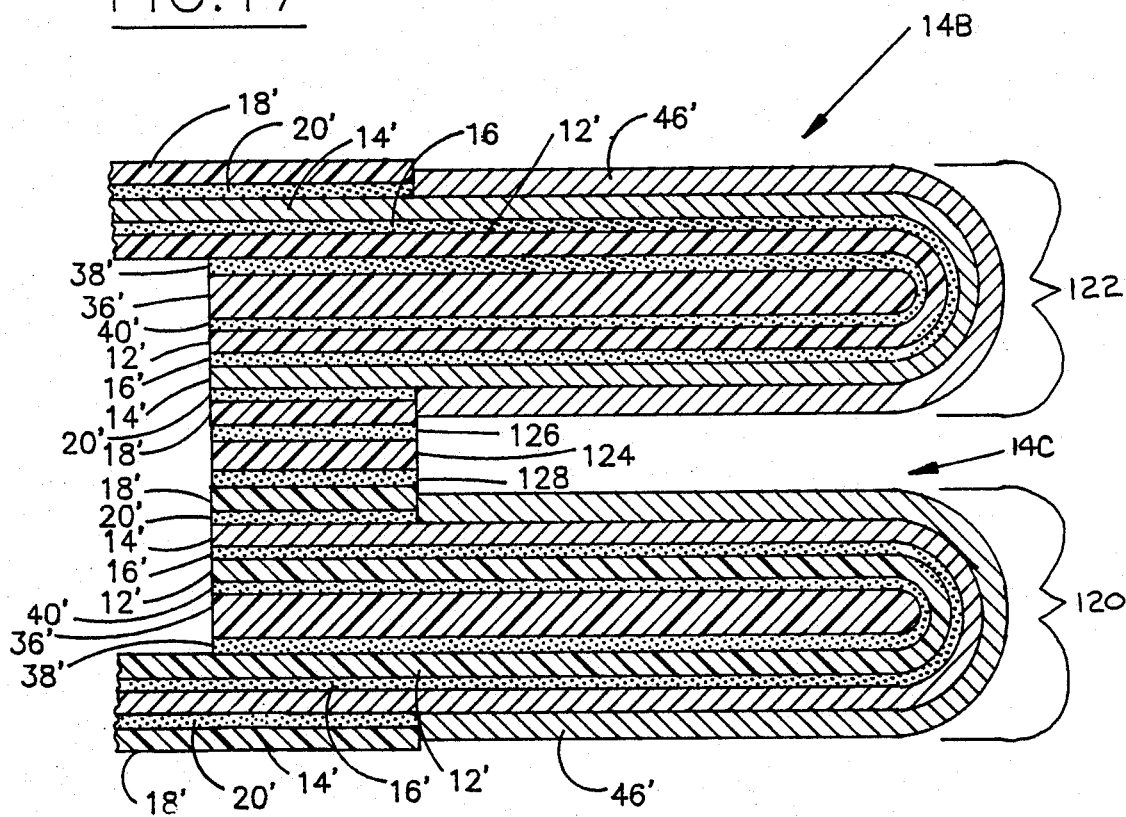
FIG. 17 is a cross-sectional elevation view along the line 17—17 of FIG. 16.

In FIGS. 15-17, another embodiment of a flexible circuit in accordance with the present invention is shown. In FIG. 15, a plan view of a flexible circuit is identified at 116 which has been folded, laminated and ablated as described in FIGS. 1-5. Flexible circuit 116 has a relatively large longitudinal cut or slot 118 therethrough so as to define a pair of attached circuits 120 and 122. It will be appreciated that circuits 120 and 122 are coplanar so that upon folding along slot 118 as shown in FIG. 16, circuits 120 and 122 will mutually align such that connector fingers 14B and 14C (which are shown having a layer of solder applied thereto) will be in facing relation as shown in cross sectional FIG. 13.

Occasionaly, an additional spacer layer 124 having been coated with adhesive layers 126 and 128 is sandwiched between circuits 120 and 122 prior to folding so that a desired spacing is defined between pins 14B and 14C. Pins 14B and 14C may be directly connected to appropriately spaced through-holes on a circuit board thereby providing a higher density connecting scheme relative to the previously described embodiments of the present invention.

Figure 18:
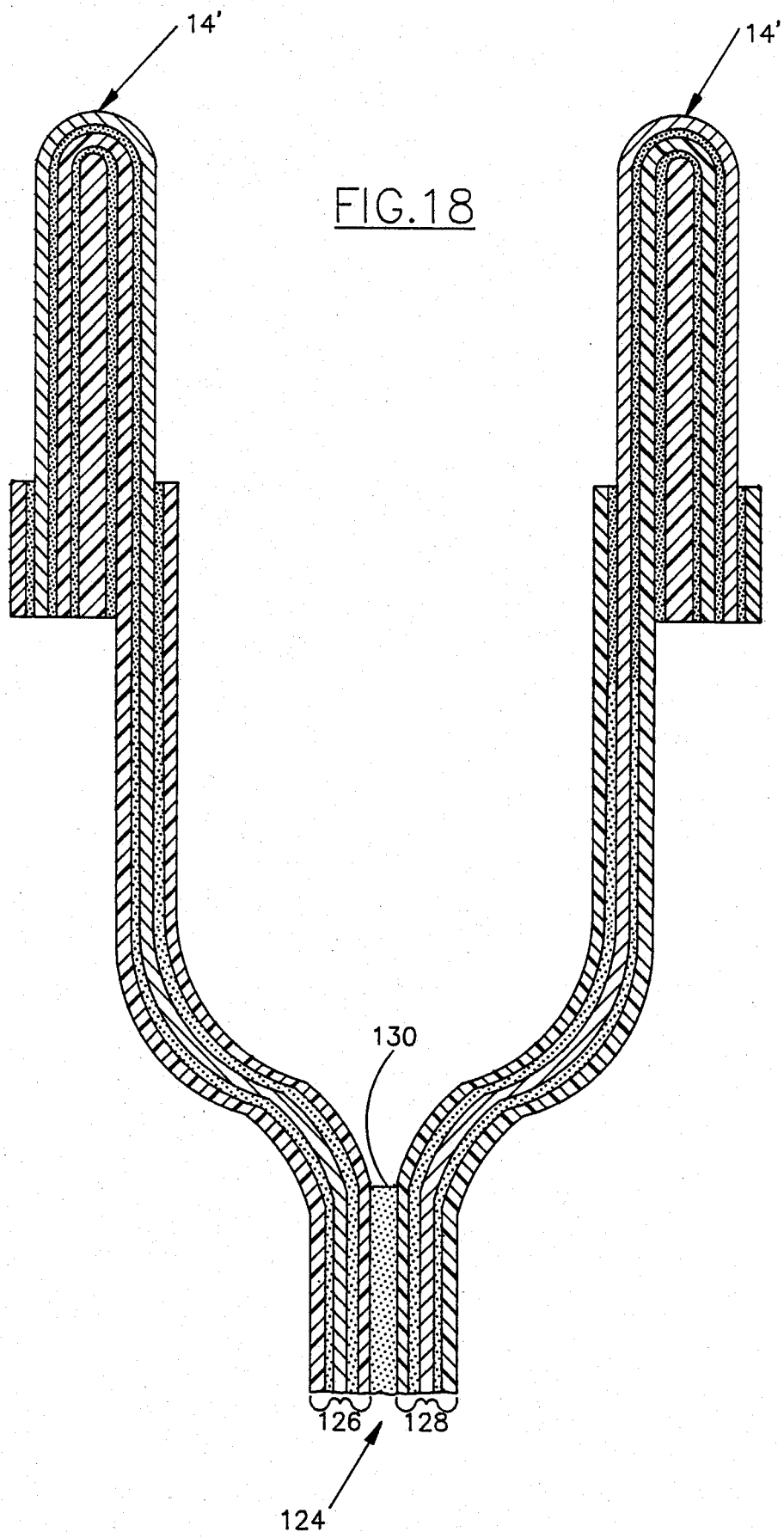
FIG. 18 is a cross-sectional elevation view of a multiple layer embodiment of a flexible circuit in accordance with the present invention.

In FIG. 18, still another embodiment of a flexible circuit in accordance with the present invention is shown. FIG. 18 depicts a multiple layer flexible circuit 124 which may be manufactured by any known method including laminating a pair of flexible circuits 126 and 128 via an adhesive layer 130. Flexible circuits 126 and 128 are of the type shown in FIG. 5. As in the embodiment described in FIGS. 15-17, the FIG. 18 embodiment provides a flexible circuit capable of effecting high density interconnections.

Figure 13A:
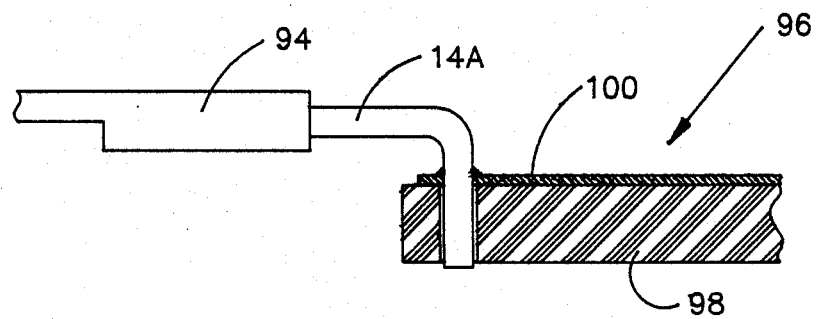
FIG. 13A is a side elevation view of a flexible circuit manufactured in accordance with the present invention connected to another electronic component.
Figure 13B:
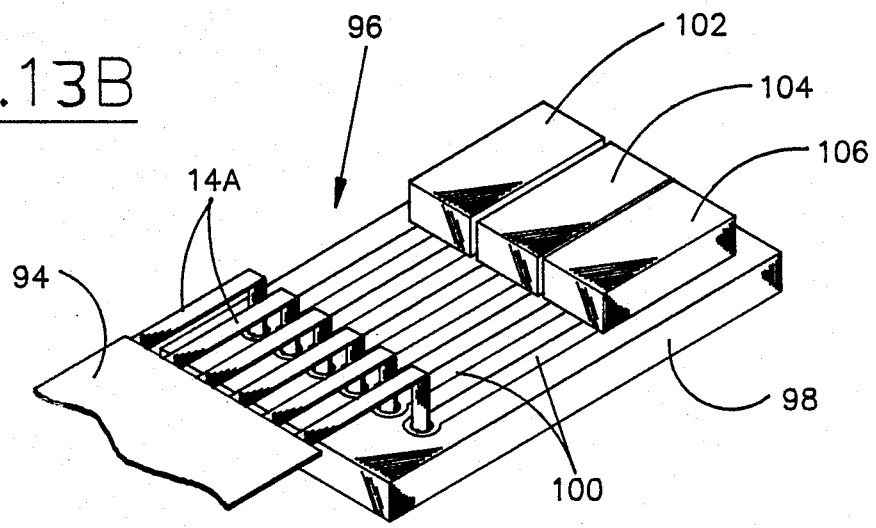
FIG. 13B is a perspective view of the flexible circuit of FIG. 13A.
Figure 19:
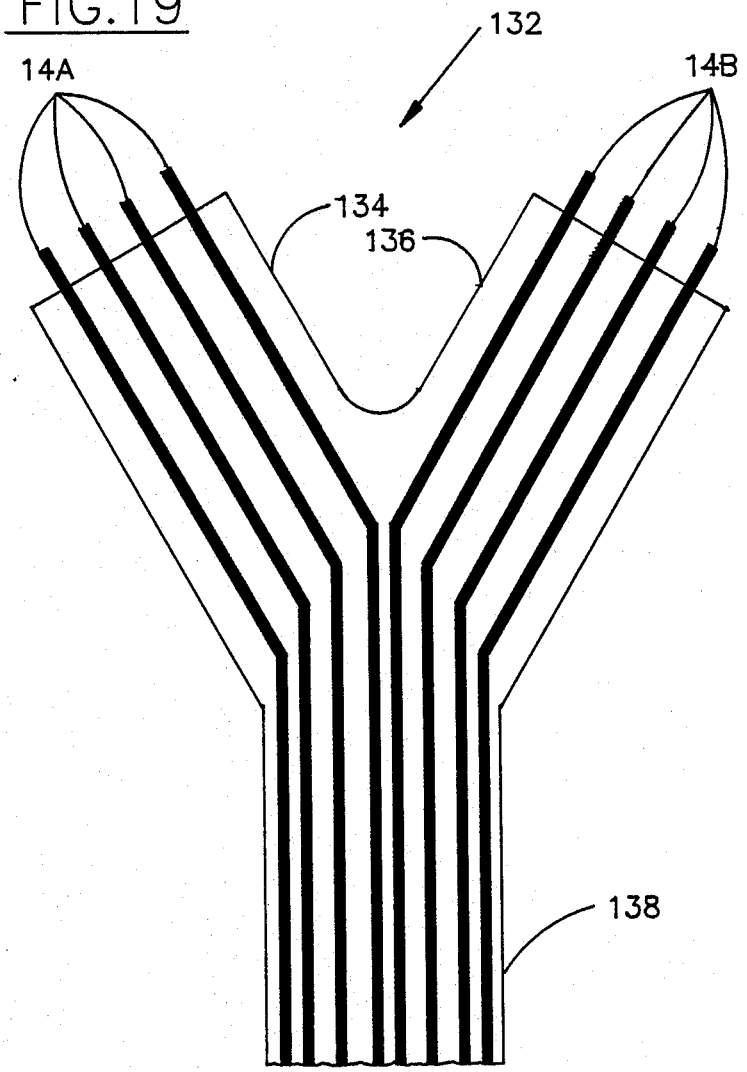
FIG. 19 is a plan view of a flexible circuit of the present invention depicting non-parallel terminations.
Figure 20:
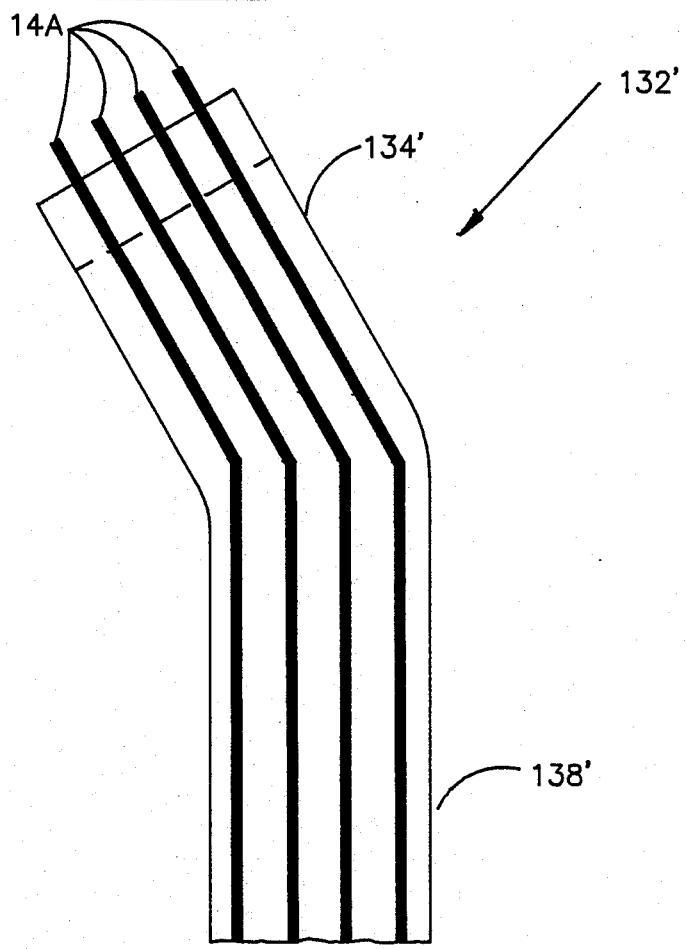
FIG. 20 is a plan view of a flexible circuit of the present invention also depicting non-parallel terminations.

The angle in which pins 14A interface with another circuit or component may be tailored by bending as shown in FIGS. 13A and 13B. Alternatively, rather than the connecting pins themselves being bent, the entire flexible circuit may be angled as in the embodiments of FIGS. 19 and 20. In FIG. 19, a flexible circuit in accordance with the present invention is shown at 132 wherein the circuit terminates in a "Y" configuration defined by forks 134 and 136. Each fork includes a plurality of connector pins 14A and 14B, respectively which are oriented into an angle relative to the main body portion of the flexible circuit identified at 138. FIG. 20 is similar to FIG. 19, however in FIG. 20, only a single angled fork 134' extends at an angle from the remaining portion 138' of flexible circuit 132'. It will be appreciated that a flexible circuit in accordance with the present invention may have any desired variation in angle (such as shown by example in FIGS. 19 and 20) so as to tailor the present invention for a multitude of interconnection applications.

Figure 21:
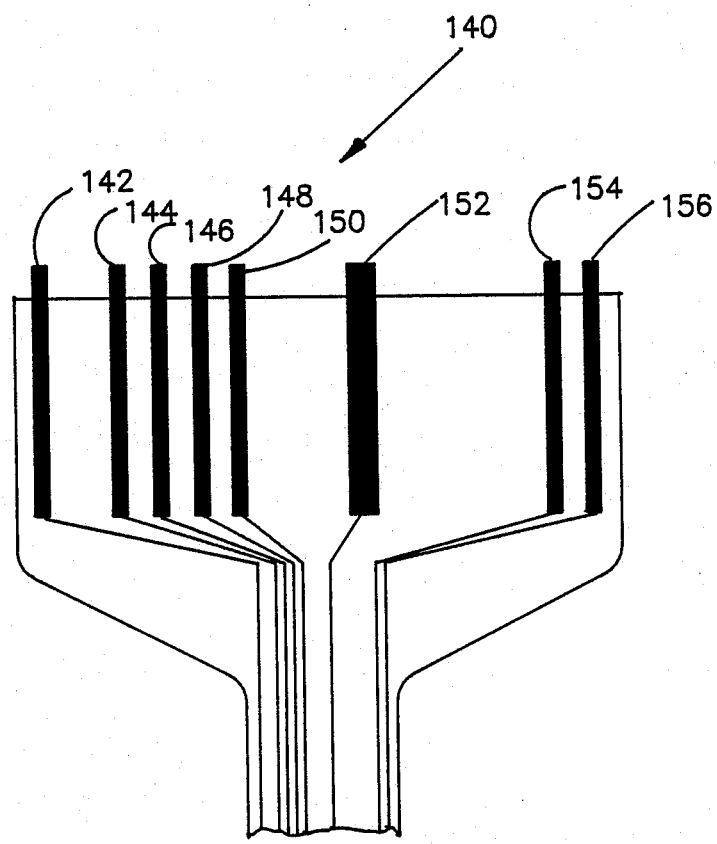
FIG. 21 is a plan view of a flexible circuit of the present invention depicting variable pitch terminal pins.

While the previously discussed FIGURES have described the circuit traces and terminal features at equally spaced intervals along the flex circuit, it will be appreciated that both the spacing between adjacent connector pins (and traces) may be varied and the width of adjacent connector pins may also be varied. Thus, in FIG. 21, a flexible circuit having variable pitch conductive patterns in accordance with the present invention is shown generally at 140. In FIG. 21, connector pins formed in accordance with the method described herein are identified at 142-156. It will be appreciated that the spacing between, for example, pins 142 and 144 and 146, 150 and 152, and 152 and 154 is different in each case. This ability to vary spacing between connector pins permits the circuit designer to more easily vary the interconnection density for any connection scheme.

Also, the width of the connector pins formed in accordance with the present invention may be varied as desired. For example, the width of pin 152 is considerably larger than the width of adjacent pins 154 and 156. The ability to vary the width of selected connector pins is a further method in which the present invention may be tailored to almost any interconnection configuration.

Figure 22A:
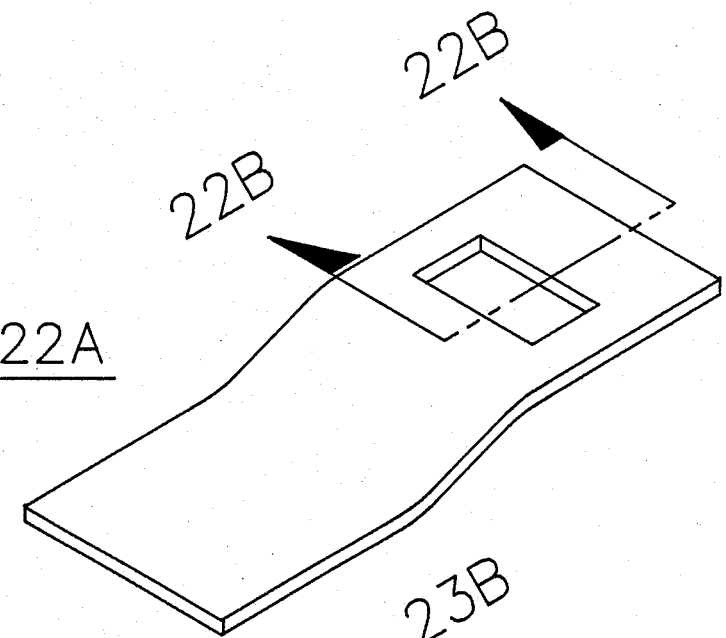
FIG. 22A is a plan view of a cover layer used in an alternative embodiment of the present invention.
Figure 23A:
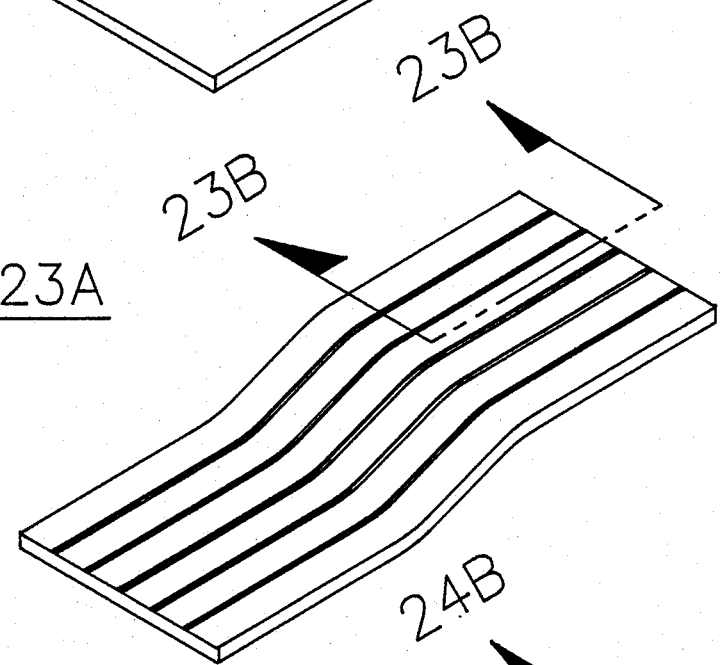
FIG. 23A is a plan view of a flexible circuit used with the cover layer of FIG. 22A.
Figure 24A:
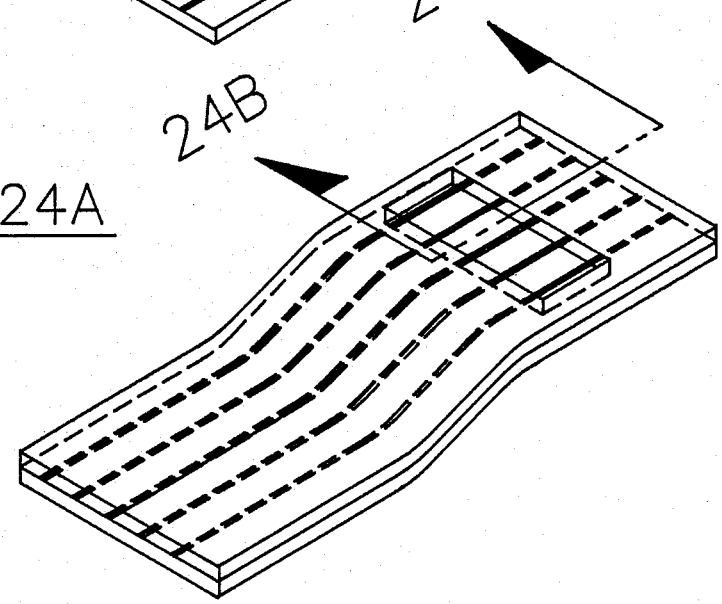
FIG. 24A is a plan view of the flexible circuits of FIGS. 22A and 23A laminated together.
Figure 22B:
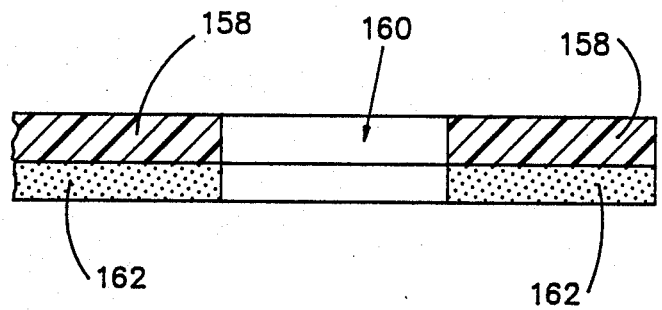
FIG. 22B is a cross-sectional elevation view along the line 22B—22B of FIG. 22A.
Figure 23B:
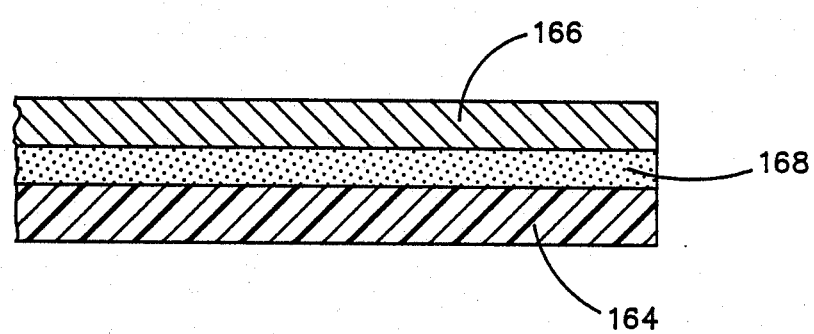
FIG. 23B is a cross-sectional elevation view along the line 23B—23B of FIG. 23A.

In FIGS. 22-27, an alternative embodiment of the present invention is shown wherein no adhesive or non-conductive layers are provided between the folded-over conductive fingers. Thus, in FIG. 22A and B, a cover layer comprising a flexible non-conductive film 158 is provided with an opening or window 160. Adhesive 162 is applied on one side of film 158. In FIGS. 23A and B, a circuit laminate is shown comprised of a flexible base 164 having a circuit pattern 166 attached to base 164 by adhesive layer 168. Next, the flexible sheets of FIGS. 22 and 23 are laminated as shown in FIGS. 24A and B to form a flexible circuit sheet with window 160 exposing conductive pattern 166.

Figure 24B:
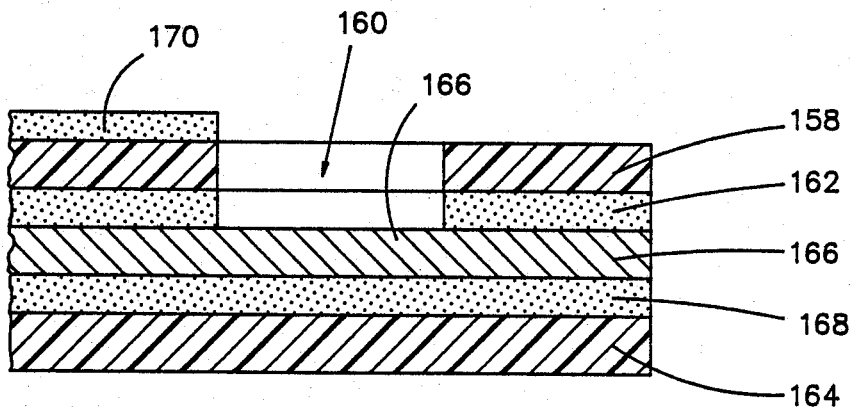
FIG. 24B is a cross-sectional elevation view along the line 24B—24B of FIG. 24A.
Figure 25A:
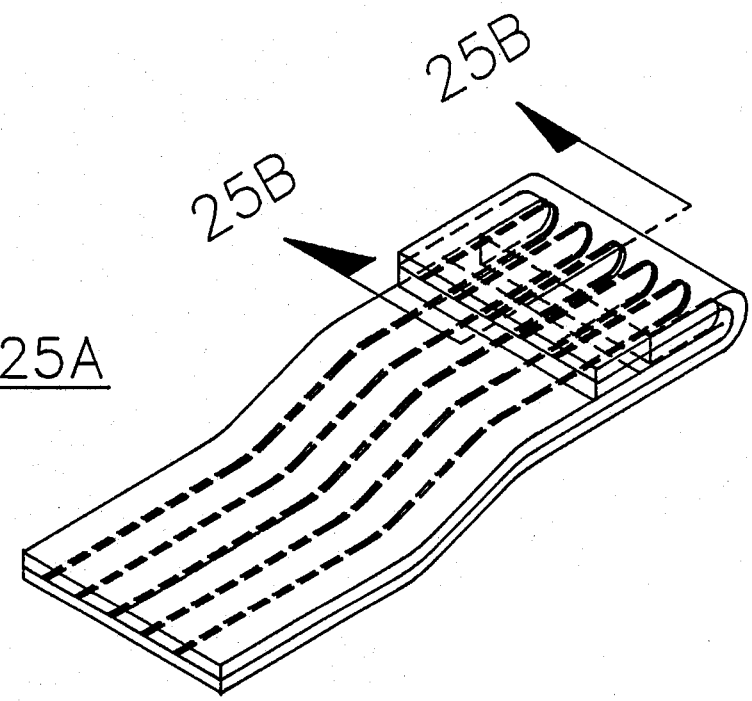
FIG. 25A is a plan view of the circuit of FIG. 24A subsequent to folding.
Figure 26A:
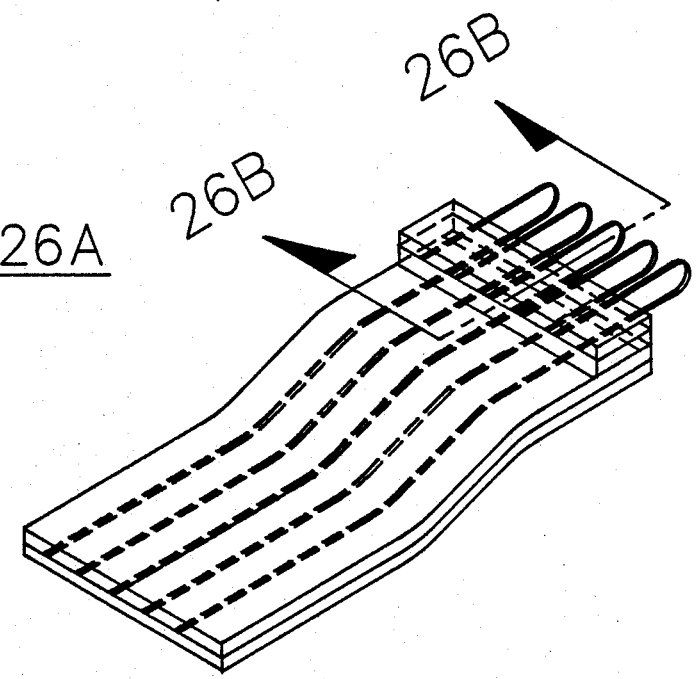
FIG. 26A is a plan view of the circuit of FIG. 25A subsequent to selected removal of laminate layers.
Figure 25B:
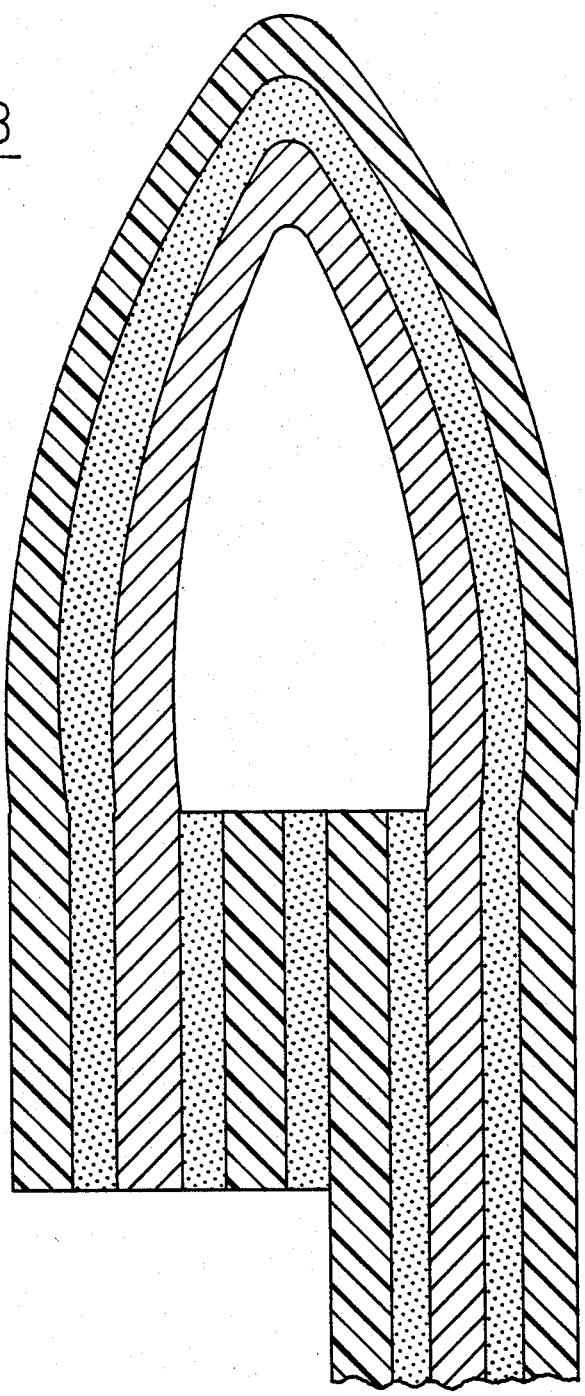
FIG. 25B is a cross-sectional elevation view along the line 25B—25B of FIG. 25A.
Figure 26B:
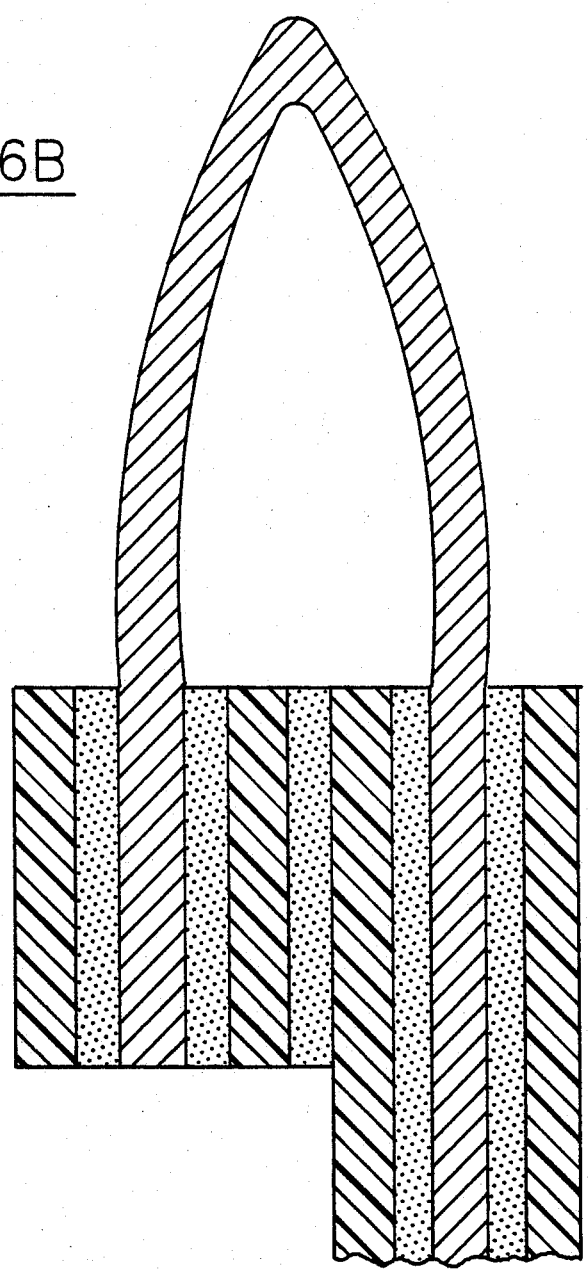
FIG. 26B is a cross-sectional elevation view along the line 26B—26B of FIG. 26A.

The circuit laminate OF FIG. 24 is then folded over on itself at about the center of window 160 so that the conductive pattern 160 contacts itself. As shown in FIGS. 24B and 25B, an adhesive layer 170 is used to hold the folded circuit together. Preferably, adhesive 170 is provided outside the area of window 160. Finally, as seen in FIGS. 26A and B, base layer 164 and adhesive 168 is selectively removed in the window to expose the conductive pattern defining a pin or finger 171 as in the previously described embodiments.

Figure 27A:
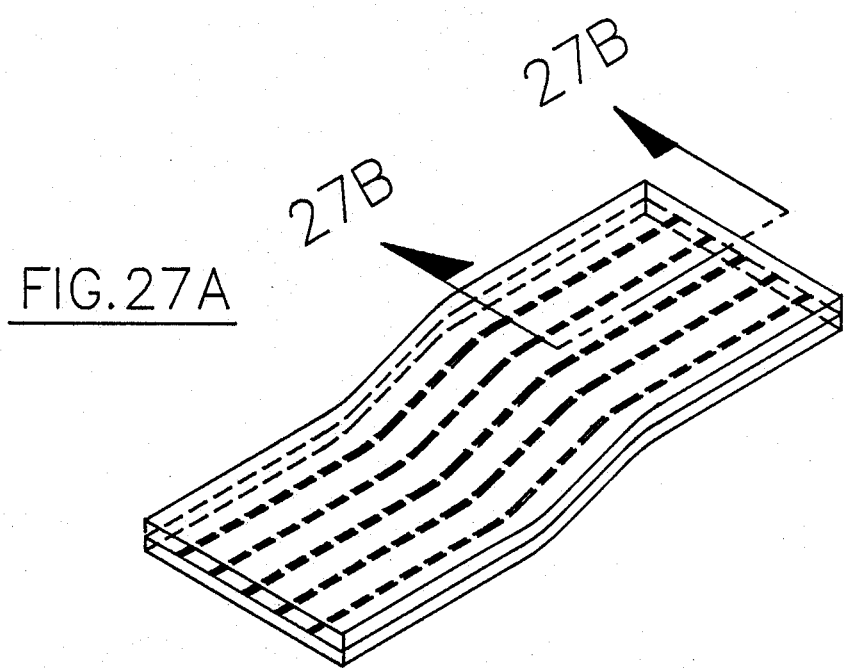
FIG. 27A is a plan view of a flexible circuit laminate.
Figure 27B:
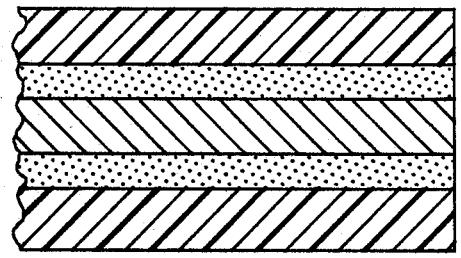
FIG. 27B is a cross-sectional elevation view along the line 27B—27B of FIG. 27A.

FIG. 27 shows a slight variation of the method of making the flexible circuit of FIGS. 22-26. Thus, in FIG. 27A and B, a laminate circuit as in FIGS. 1A and B is formed. This laminate comprises a conductive pattern 172 sandwiched between a flexible base film 174 and cover film 176 and laminated with a pair of adhesive layers 178 and 180. Next a window is formed in the flexible laminate by removing a portion of cover film 176 and adhesive layer 180 to expose conductive traces 172. This window is spaced a preselected distance from the edge 184 of the circuit laminate. It will be appreciated that at the point, the flexible circuit of FIG. 27 is substantially similar to the flexible circuit depicted in FIG. 24. Accordingly, as in FIGS. 24–26, an additional adhesive layer is applied to the laminate outside of window 160 followed by folding and formation of connective pins or fingers as explained in FIGS. 24–26.

The FIGS. 22–27 embodiment of the present invention thus provides connective fingers without any spacer or other non-conductive material or adhesive between the folded over conductive pattern. This embodiment has several advantages including the ability to be plated or soldered completely on the conductor surface.

The flexible circuit of the present invention has many features and advantages relative to those prior art techniques described above which have been used in effecting interconnections between flexible circuits and other electronic components. For example, when comparing the present invention to prior art methods utilizing separate connectors, it will be appreciated that the present invention will lead to far lower manufacturing and purchasing costs as there is no longer a requirement for the use of said separate connectors (since the connection is an integral part of the flexible circuit itself). Thus, the present invention has lower costs associated therewith relative to custom separate connectors as well as lower lead time since the designing and manufacturing of separate custom connectors is no longer necessary. The present invention is also far more reliable relative to the use of separate connectors. This is due, in part, to the fact that the present invention permits 66 percent less interconnection points since it connects directly from the flexible circuit to a board or other component. It will be appreciated that in prior art separate connectors, there is a connection between a first connector and the flex circuit and another connection between a second connector and the board to be connected; as well as a third connection between the first and second connectors. Also, relative to well known edge card connectors, there is a reduction in interconnections of 50 percent. By foregoing the use of separate connectors, the flexible circuit of the present invention has far improved impedance control, has less space requirements, has a lower weight, utilizes low cost circuit tooling, has pliable termination pins, fewer circuits and far more system design freedom.

Similarly, the flexible circuit of the present invention includes many improvements over those prior art flexible circuits identified hereinabove as being formed using substractive methods. For example, the present invention utilizes conventional, easily obtainable and relatively inexpensive to manufacture, flexible circuits formed using common flexible circuit formation techniques. In contrast, the prior art flexible circuit utilizes expensive substractive techniques wherein thick layers of conductive material (i.e., copper) are thinned down in the central portion of the flexible circuit to provide thicker terminating ends and thinner interior portions. As mentioned, this leads to expensive imaging, etching and manufacturing steps as well as higher material costs.

The flexible circuit of the present invention may be easily manufactured to provide non-standard termination configurations (FIGS. 8 and 9) which may be infinitely varied (FIGS. 10, 19 and 20). Also, the terminations may be in multiple planes (FIGS. 11 and 12), and comprise high density interconnections (FIGS. 17, 18 and 21).

It will also be appreciated that while the preferred embodiment of the present invention utilizes a spacer layer to achieve adequate thickness of the terminals pins 14A, alternatively, the spacer layer may be dispensed with whereby the adequate thickness may be achieved from using thicker substrate (i.e., base and cover) materials or conductive layers. Also, while the various laminates have been shown wherein an adhesive material is utilized between the conductive trace and base substrate, it will be appreciated that that layer of adhesive may be dispensed with if the traces are created directly on the substrate using known methods (e.g. vapor sputtering).

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A flexible circuit having individual spaced connection pins for direct insertion into holes in a mating electrical component, comprising:

flexible circuit means having opposed planar surfaces and including conductive pattern means sandwiched between a non-conductive flexible base layer and a non-conductive flexible cover layer, a first adhesive layer between said cover layer and said conductive pattern means, said flexible circuit means having a first end with said pattern means comprising a plurality of spaced traces terminating at or near said circuit means first end;

said first end of said circuit means being folded on itself wherein a first portion of said base layer at said first end is attached to a second portion of said base layer spaced from said first end, said first and second portions of said base layer being attached by a second layer of adhesive;

at least a portion of said flexible cover layer and said first adhesive layer on said folded circuit means first end being removed to expose said traces and said flexible base layer; and at least a portion of said flexible base layer and said second adhesive layer on said folded circuit means first end being removed from the spaces between said spaced traces wherein said spaced traces disposed on said first and second attached portions of said unremoved base layer define a plurality of said individual spaced connection pins for direct insertion into holes in a mating electrical component with each of said connection pins having only a single one of said traces thereon.

2. The circuit of claim 1 including:

a spacer layer having a preselected thickness and width attached to said base layer on said circuit means first end;

said first end of said circuit means enclosing and capturing said spacer layer when said first end is folded wherein said spacer layer is sandwiched and held by said second adhesive layer between said first and second portions of said base layer; and said spacer layer being removed from the spaces between said spaced traces whereby said spaced traces disposed on said unremoved base layer and spacer layer define said individual connection pins.

3. The circuit of claim 2 wherein said circuit means first end terminates at a terminal edge and wherein:
said spacer layer is positioned on said base layer a preselected distance from said terminal edge, said preselected distance being substantially equal to the width of said spacer layer.

4. The circuit of claim 1 including:
a third layer of adhesive between said pattern means and said flexible base layer.

5. The circuit of claim 2 including:
a third layer of adhesive between said pattern means and said flexible base layer.

6. The circuit of claim 1 including:
a longitudinal slit through said folded first end of said circuit means between two adjacent connection pins.

7. The circuit of claim 1 including:
a layer of solder on said connection pins.

8. The circuit of claim 1 wherein:
said connection pins are angled to a configuration other than 180 degrees.

9. The circuit of claim 1 including:
a longitudinal slot through a portion of said circuit means including said circuit means first end to define a pair of coplanar first and second circuit sections; and
said first circuit section being folded on said second circuit section along said longitudinal slot to define two substantially parallel rows of individual connection pins.

10. The circuit of claim 9 including:
a second spacer layer disposed between said first and second circuit sections; and
adhesive on said second spacer layer and between said first and second circuit sections.

11. The circuit of claim 1 including:
an electronic circuit device having through-hole means; and
said individual connection pins being connected to said through-hole means.

12. The circuit of claim 1 wherein:
the spacing between adjacent connection pins is variable.

13. The circuit of claim 1 wherein each connection pin has a preselected width and wherein:
the width of adjacent connection pins is variable.

14. The circuit of claim 1 wherein:
said flexible circuit means is angled.

15. A flexible circuit having individual spaced connection pins for direct insertion into holes in a mating electrical component, comprising:
flexible circuit means having opposed planar surfaces and including conductive pattern means sandwiched between a non-conductive flexible base layer and a non-conductive flexible cover layer, a first adhesive layer between said cover layer and said conductive pattern means, said flexible circuit means having a first end with said pattern means comprising a plurality of spaced traces terminating at or near said circuit means first end;
said first end of said circuit means being folded on itself wherein a first portion of said cover layer at said first end is attached to a second portion of said cover layer spaced from said first end, said first and second portions of said cover layer being attached by a second layer of adhesive;
at least a portion of said flexible base layer on said folded circuit means first end being removed to expose said traces and said flexible cover layer; and
at least a portion of said flexible cover layer and said first and second adhesive layers on said folded circuit means first end being removed from the spaces between said spaced traces wherein said spaced traces disposed on said first and second attached portions of said unremoved cover layer define a plurality of said individual spaced connection pins for direct insertion into holes in a mating electrical component with each of said connection pins having only a single one of said traces thereon.

16. The circuit of claim 15 including:
a spacer layer having a preselected thickness and width attached to said cover layer on said circuit means first end;
said first end of said circuit means enclosing and capturing said spacer layer when said first end is folded wherein said spacer layer is sandwiched and held by said second adhesive layer between said first and second portions of said cover layer; and
said spacer layer being removed from the spaces between said spaced traces whereby said spaced traces disposed on said unremoved cover layer and spacer layer define said individual connection pins.

17. The circuit of claim 16 wherein said circuit means first end terminates at a terminal edge and wherein:
said spacer layer is positioned on said cover layer a preselected distance from said terminal edge, said preselected distance being substantially equal to the width of said spacer layer.

18. The circuit of claim 15 including:
a third layer of adhesive between said pattern means and said flexible base layer.

19. The circuit of claim 16 including:
a third layer of adhesive between said pattern means and said flexible base layer.

20. The circuit of claim 15 including:
a longitudinal slit through said folded first end of said circuit means between two adjacent connection pins.

21. The circuit of claim 15 including:
a layer of solder on said connection pins.

22. The circuit of claim 15 wherein:
said connection pins are angled to a configuration other than 180 degrees.

23. The circuit of claim 15 including:
a longitudinal slot through a portion of said circuit means including said circuit means first end to define a pair of coplanar first and second circuit sections; and
said first circuit section being folded on said second circuit section along said longitudinal slot to define two substantially parallel rows of individual connection pins.

24. The circuit of claim 23 including:
a second spacer layer disposed between said first and second circuit sections; and
adhesive on said second spacer layer and between said first and second circuit sections.

25. The circuit of claim 15 including:
an electronic circuit device having through-hole means; and
said individual connection pins being connected to said through-hole means.

26. The circuit of claim 15 wherein:
the spacing between adjacent connection pins is variable.

27. The circuit of claim 15 wherein each connection pin has a preselected width and wherein:
the width of adjacent connection pins is variable.

28. The circuit of claim 15 wherein:
said flexible circuit means is angled.

29. A method of making a flexible circuit having individual spaced connection pins for direct insertion into holes in a mating electrical component, comprising the steps of:
forming flexible circuit means having opposed planar surfaces and including conductive pattern means sandwiched between a non-conductive flexible base layer and a non-conductive flexible cover layer, a first adhesive layer between said cover layer and said conductive pattern means, said flexible circuit means having a first end with said pattern means comprising a plurality of spaced traces terminating at or near said circuit means first end;
folding said first end of said circuit means on itself wherein a first portion of said base layer at said first end is attached to a second portion of said base layer spaced from said first end, said first and second portions of said base layer being attached by a second layer of adhesive;
removing at least a portion of said flexible cover layer and said first adhesive layer on said folded circuit means first end to expose said traces and said flexible base layer; and
removing at least a portion of said flexible base layer and second adhesive layer on said folded circuit means first end from the spaces between said spaced traces wherein said spaced traces disposed on said first and second portions of said unremoved base layer define a plurality of said individual spaced connection pins for direct insertion into holes in a mating electrical component with each of said connection pins having only a single one of said traces thereon.

30. The method of claim 29 including:
attaching a spacer layer having a preselected thickness and width to said base layer on said circuit means first end;
enclosing and capturing said spacer layer in said first end of said circuit means when said first end is folded wherein said spacer layer is sandwiched and held by said second adhesive layer between said first and second portions of said base layer; and
removing said spacer layer from the spaces between said spaced traces whereby said spaced traces disposed on said unremoved base layer and spacer layer define said individual pins.

31. The method of claim 30 wherein said circuit means first end terminates at a terminal edge and including:
positioning said spacer layer on said base layer a preselected distance from said terminal edge, said preselected distance being substantially equal to the width of said spacer layer.

32. The method of claim 29 including:
providing a third layer of adhesive between said pattern means and said flexible base layer.

33. The method of claim 29 including:
providing a longitudinal slit through said folded first end of said circuit means between two adjacent connection pins.

34. The method of claim 29 including:
providing a layer of solder on said connection pins.

35. The method of claim 29 including:
bending said connection pins to a configuration other than 180 degrees.

36. The method of claim 29 including:
providing a longitudinal slot through a portion of said circuit means including said circuit means first end to define a pair of coplanar first and second circuit sections; and
folding said first circuit section along said longitudinal slot to define two substantially parallel rows of individual connection pins.

37. The method of claim 36 including:
providing a second spacer layer between said first and second circuit sections; and
providing adhesive on said second spacer layer and between said first and second circuit sections.

38. The method of claim 29 including an electronic circuit device having through-hole means and including the step of:
connecting said individual connection pins to said through-hole means.

39. The method of claim 29 wherein:
said removing steps utilize a laser.

40. A method of making a flexible circuit having individual spaced connection pins for direct insertion into holes in a mating electrical component, comprising the steps of:
forming flexible circuit means having opposed planar surfaces and including conductive pattern means sandwiched between a non-conductive flexible base layer and a non-conductive flexible cover layer, a first adhesive layer between said cover layer and said conductive pattern means, said flexible circuit means having a first end with said pattern means comprising a plurality of spaced traces terminating at or near said circuit means first end;
folding said first end of said circuit means on itself wherein a first portion of said cover layer at said first end is attached to a second portion of said cover layer spaced from said first end, said first and second portions of said cover layer being attached by a second layer of adhesive;
removing at least a portion of said flexible base layer on said folded circuit means first end to expose said traces and said flexible cover layer; and
removing at least a portion of said flexible cover layer and said first and second adhesive layers on said folded circuit means first end from the spaces between said spaced traces wherein said spaced traces disposed on said first and second portions of said unremoved cover layer define a plurality of said individual spaced connection pins for direct insertion into holes in a mating electrical component with each of said connection pins having only a single one of said traces thereon.

41. The method of claim 40 including:
attaching a spacer layer having a preselected thickness and width to said cover layer on said circuit means first end;
enclosing and capturing said spacer layer in said first end of said circuit means when said first end is folded wherein said spacer layer is sandwiched and held by said second adhesive layer between said first and second portions of said cover layer; and
removing said spacer layer from the spaces between said spaced traces whereby said spaced traces disposed on said unremoved cover layer and spacer layer define said individual pins.

42. The method of claim 41 wherein said circuit means first end terminates at a terminal edge and including:
positioning said spacer layer on said cover layer a preselected distance from said terminal edge, said preselected distance being substantially equal to the width of said spacer layer.

43. The method of claim 40 including:
providing a third layer of adhesive between said pattern means and said flexible base layer.

44. The method of claim 40 including:
providing a longitudinal slot through a portion of said circuit means including said circuit means first end to define a pair of coplanar first and second circuit sections; and
folding said first circuit section along said longitudinal slot to define two substantially parallel rows of individual connection pins.

45. The method of claim 44 including:
providing a second spacer layer between said first and second circuit sections; and
providing adhesive on said second spacer layer and between said first and second circuit sections.

46. The method of claim 40 including an electronic circuit device having through-hole means and
connecting said individual connection pins to said through-hole means.

47. The method of claim 40 wherein:
said removing steps utilize a laser.

48. A flexible circuit having individual spaced connection pins for direct insertion into holes in a mating electrical component, comprising:
flexible circuit means having opposed planar surfaces and including conductive pattern means sandwiched between a non-conductive flexible base layer and a non-conductive flexible cover layer, a first adhesive layer between said cover layer and said conductive pattern means, said flexible circuit means having a first end with said pattern means comprising a plurality of spaced traces terminating at or near said circuit means first end;
an opening spaced from said first end and formed through said first adhesive layer and said cover layer wherein said conductive pattern means is exposed;
said first end of said circuit means being folded on itself wherein a first portion of said cover layer at said first end is attached to a second portion of said cover layer spaced from said first end and wherein said spaced traces in said opening fold on themselves, said first and second portions of said cover layer being attached by a second layer of adhesive;
at least a portion of said flexible base layer on said folded circuit means first end being removed to expose said folded traces in said opening; and
at least a portion of said flexible base layer on said folded circuit means first end being removed from the spaces between said spaced traces in said opening to define a plurality of said individual spaced connection pins for direct insertion into holes in a mating electrical component with each of said connection pins having only a single one of said traces thereon.

49. The circuit of claim 48 including:
a third layer of adhesive between said pattern means and said flexible base layer.

50. The circuit of claim 48 including:
a longitudinal slit through said folded first end of said circuit means between two adjacent connection pins.

51. The circuit of claim 48 including:
a layer of solder on said connection pins.

52. The circuit of claim 48 including:
an electronic circuit device having through-hole means; and
said individual connection pins being connected to said through-hole means.

53. The circuit of claim 48 wherein:
the spacing between adjacent connection pins is variable.

54. The circuit of claim 48 wherein each connection pin has a preselected width and wherein:
the width of adjacent connection pins is variable.

55. The circuit of claim 48 wherein:
said flexible circuit means is angled.

56. A method of making a flexible circuit having individual spaced connection pins for direct insertion into holes in a mating electrical component, comprising the steps of:
forming flexible circuit means having opposed planar surfaces and including conductive pattern means sandwiched between a non-conductive flexible base layer and a non-conductive flexible cover layer, a first adhesive layer between said cover layer and said conductive pattern means, said flexible circuit means having a first end with said pattern means comprising a plurality of spaced traces terminating at or near said circuit means first end;
forming an opening spaced from said first end through said first adhesive layer and said cover layer wherein said conductive pattern means is exposed;
folding said first end of said circuit means on itself wherein a first portion of said cover layer at said first end is attached to a second portion of said cover layer spaced from said first end and wherein said spaced traces in said opening fold on themselves, said first and second portions of said cover layer being attached by a second layer of adhesive;
removing at least a portion of said flexible base layer on said folded circuit means first end to expose said folded traces in said opening; and
removing at least a portion of said flexible base layer on said folded circuit means first end from the spaces between said spaced traces in said opening to define a plurality of said individual spaced connection pins for direct insertion into holes in a mating electrical component with each of said connection pins having only a single one of said traces thereon.

57. The method of claim 56 including:
providing a third layer of adhesive between said pattern means and said flexible base layer.

58. The method of claim 57 including:
providing a longitudinal slit through said folded first end of said circuit means between two adjacent connection pins.

59. The method of claim 56 including:
providing a layer of solder on said connection pins.

60. The method of claim 56 including an electronic circuit device having through-hole means and including the step of:
connecting said individual connection pins to said thhrough-hole means.

61. The method of claim 56 wherein:
said removing step utilizes a laser.

62. The method of claim 56 wherein:
said opening is formed by removing said first adhesive and said cover layer by utilizing a laser.

63. The flexible circuit of claim 1 wherein:
said flexible cover layer, first adhesive layer, flexible base layer and second adhesive layer are removed subsequent to said circuit means being folded.

64. The flexible circuit of claim 15 wherein:
said flexible base layer, flexible cover layer and first and second adhesive layers are removed subsequent to said circuit means being folded.

65. The method of claim 29 wherein:
said flexible cover layer, first adhesive layer, flexible base layer and second adhesive layer are removed subsequent to said folding step.

66. The method of claim 40 wherein:
said flexible base layer, flexible cover layer and first and second adhesive layers are removed subsequent to said folding step.

67. The flexible circuit of claim 48 wherein:
said flexible base layer is removed subsequent to said circuit means being folded.

68. The flexible circuit of claim 56 wherein:
said flexible base layer is removed subsequent to said circuit means being folded.

69. A flexible circuit comprising:
flexible circuit means having opposed planar surfaces and including conductive pattern means sandwiched between a non-conductive flexible base layer and a non-conductive flexible cover layer, a first adhesive layer between said cover layer and said conductive pattern means, said flexible circuit means having a first end with said pattern means comprising a plurality of spaced traces terminating at or near said circuit means first end;
said first end of said circuit means being folded on itself wherein a first portion of said base layer at said first end is attached to a second portion of said base layer spaced from said first end, said first and second portions of said base layer being attached by a second layer of adhesive;
at least a portion of said flexible cover layer and said first adhesive layer on said folded circuit means first end being removed to expose said traces and said flexible base layer;
at least a portion of said flexible base layer and said second adhesive layer on said folded circuit means first end being removed from the spaces between said spaced traces wherein said spaced traces disposed on said first and second attached portions of said unremoved base layer define a plurality of individual spaced connection pins;
a longitudinal slot through a portion of said circuit means including said circuit means first end to define a pair of coplanar first and second circuit sections; and
said first circuit section being folded on said second circuit section along said longitudinal slot to define two substantially parallel rows of said individual connection pins.

70. The circuit of claim 69 including:
a second spacer layer disposed between said first and second circuit sections; and
adhesive on said second spacer layer and between said fist and second circuit sections.

71. A flexible circuit comprising:
flexible circuit means having opposed planar surfaces and including conductive pattern means sandwiched between a non-conductive flexible base layer and a non-conductive flexible cover layer, a first adhesive layer between said cover layer and said conductive pattern means, said flexible circuit means having a first end with said pattern means comprising a plurality of spaced traces terminating at or near said circuit means first end;
said first end of said circuit means being folded on itself wherein a first portion of said cover layer at said first end is attached to a second portion of said cover layer spaced from said first end, said first and second portions of said cover layer being attached by a second layer of adhesive;
at least a portion of said flexible base layer on said folded circuit means first end being removed to expose said traces and said flexible cover layer;
at least a portion of said flexible cover layer and said first and second adhesive layers on said folded circuit means first end being removed from the spaces between said spaced traces wherein said spaced traces disposed on said first and second attached portions of said unremoved cover layer define a plurality of individual spaced connection pins;
a longitudinal slot through a portion of said circuit means including said circuit means first end to define a pair of coplanar first and second circuit sections; and
said first circuit section being folded on said second circuit section along said longitudinal slot to define two substantially parallel rows of said individual connection pins.

72. The circuit of claim 71 including:
a second spacer layer disposed between said first and second circuit sections; and
adhesive on said second spacer layer and between said first and second circuit sections.

73. A method of making a flexible circuit comprising the steps of:
forming flexible circuit means having opposed planar surfaces and including conductive pattern means sandwiched between a non-conductive flexible base layer and a non-conductive flexible cover layer, a first adhesive layer between said cover layer and said conductive pattern means, said flexible circuit means having a first end with said pattern means comprising a plurality of spaced traces terminating at or near said circuit means first end;
folding said first end of said circuit means on itself wherein a first portion of said base layer at said first end is attached to a second portion of said base layer spaced from said first end, said first and second portions of said base layer being attached by a second layer of adhesive;
removing at least a portion of said flexible cover layer and said first adhesive layer on said folded circuit means first end to expose said traces and said flexible base layer;
removing at least a portion of said flexible base layer and second adhesive layer on said folded circuit means first end from the spaces between said spaced traces wherein said spaced traces disposed on said first and second portions of said unremoved base layer define a plurality of individual spaced connection pins;

providing a longitudinal slot through a portion of said circuit means including said circuit means first end to define a pair of coplanar first and second circuit sections; and folding said first circuit section along said longitudinal slot to define two substantially parallel rows of individual connection pins.

74. The method of claim 73 including:

providing a second spacer layer between said first and second circuit sections; and providing adhesive on said second spacer layer and between said first and second circuit sections.

75. A method of making a flexible circuit comprising the steps of:

forming flexible circuit means having opposed planar surfaces and including conductive pattern means sandwiched between a non-conductive flexible base layer and a non-conductive flexible cover layer, a first adhesive layer between said cover layer and said conductive pattern means, said flexible circuit means having a first end with said pattern means comprising a plurality of spaced traces terminating at or near said circuit means first end;

folding said first end of said circuit means on itself wherein a first portion of said cover layer at said first end is attached to a second portion of said cover layer spaced from said first end, said first and second portions of said cover layer being attached by a second layer of adhesive;

removing at least a portion of said flexible base layer on said folded circuit means first end to expose said traces and said flexible cover layer;

removing at least a portion of said flexible cover layer and said first and second adhesive layers on said folded circuit means first end from the spaces between said spaced traces wherein said spaced traces disposed on said first and second portions of said unremoved cover layer define a plurality of individual spaced connection pins;

providing a longitudinal slot through a portion of said circuit means including said circuit means first end to define a pair of coplanar first and second circuit sections; and folding said first circuit section along said longitudinal slot to define two substantially parallel rows of individual connection pins.

76. The method of claim 75 including:

providing a second spacer layer between said first and second circuit sections; and providing adhesive on said second spacer layer and between said first and second circuit sections.

* * * * *